(12) United States Patent
Chuang

(10) Patent No.: US 11,037,933 B2
(45) Date of Patent: Jun. 15, 2021

(54) SEMICONDUCTOR DEVICE WITH SELECTIVELY FORMED INSULATING SEGMENTS AND METHOD FOR FABRICATING THE SAME

(71) Applicant: NANYA TECHNOLOGY CORPORATION, New Taipei (TW)

(72) Inventor: Ching-Cheng Chuang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/524,811

(22) Filed: Jul. 29, 2019

(65) Prior Publication Data

US 2021/0035978 A1 Feb. 4, 2021

(51) Int. Cl.
*H01L 27/108* (2006.01)

(52) U.S. Cl.
CPC .... *H01L 27/1087* (2013.01); *H01L 27/10829* (2013.01); *H01L 27/10888* (2013.01)

(58) Field of Classification Search
CPC ......... H01L 27/10811; H01L 27/10864; H01L 27/1087; H01L 27/10888
See application file for complete search history.

(56) References Cited

U.S. PATENT DOCUMENTS

2006/0046419 A1* 3/2006 Sandhu ................... H01L 28/91
438/386
2007/0264788 A1* 11/2007 Lee ................... H01L 29/66621
438/386

* cited by examiner

*Primary Examiner* — Suberr L Chi
(74) *Attorney, Agent, or Firm* — Muncy, Geissler, Olds & Lowe, P.C.

(57) ABSTRACT

The present application discloses a method for fabricating a semiconductor device including providing a substrate, forming a growing base film above the substrate, forming a plurality of doped segments and a plurality of undoped segments in the growing base film, selectively forming a plurality of insulating segments on the plurality of undoped segments, removing the plurality of doped segments, and forming a plurality of capacitor structures above the substrate.

18 Claims, 36 Drawing Sheets

SEMICONDUCTOR DEVICE WITH SELECTIVELY FORMED INSULATING SEGMENTS AND METHOD FOR FABRICATING THE SAME

TECHNICAL FIELD

The present disclosure relates to a semiconductor device and a method for fabricating the semiconductor device, and more particularly, to a semiconductor device with selectively formed insulating segments and a method for fabricating the semiconductor device with selectively formed insulating segments.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process and impact the final electrical characteristics, quality, and yield. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for fabricating a semiconductor device including providing a substrate, forming a growing base film above the substrate, forming a plurality of doped segments and a plurality of undoped segments in the growing base film, selectively forming a plurality of insulating segments on the plurality of undoped segments, removing the plurality of doped segments, and forming a plurality of capacitor structures above the substrate.

In some embodiments, forming a plurality of doped segments and a plurality of undoped segments in the growing base film comprise patterning the growing base film with a photoresist layer and a mask, implanting the growing base film from above, and removing the photoresist layer.

In some embodiments, the substrate is formed of silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, or indium gallium phosphide.

In some embodiments, the growing base film is formed of an insulating material without nitrogen.

In some embodiments, the growing base film is formed of silicon oxide, undoped silica glass, borosilica glass, phosphosilica glass, or borophosphosilica glass.

In some embodiments, the plurality of insulating segments are formed by chemical vapor deposition in the presence of ozone and tetraethyloxysilane.

In some embodiments, the plurality of doped segments comprise nitrogen.

In some embodiments, each of the plurality of capacitor structures comprises a bottom electrode, a capacitor insulating layer, and a top electrode.

In some embodiments, the method further comprises forming, after providing the substrate, a plurality of isolation structures in the substrate.

In some embodiments, the method further comprises forming a plurality of bit line contacts above the substrate.

In some embodiments, the method further comprises forming a plurality of bit lines above the substrate.

In some embodiments, the capacitor insulating layer is formed of barium strontium titanate, lead zirconium titanate, titanium oxide, aluminum oxide, hafnium oxide, yttrium oxide, or zirconium oxide.

In some embodiments, the capacitor insulating layers are formed of multiple layers consisting of silicon oxide, silicon nitride, and silicon oxide.

In some embodiments, the bottom electrode is formed of doped polysilicon, metal silicide, aluminum, copper, or tungsten.

In some embodiments, the top electrode is formed of doped polysilicon, copper, or aluminum.

In some embodiments, the plurality of isolation structures are formed of silicon oxide, silicon nitride, silicon oxynitride, silicon nitride oxide, or fluoride-doped silicate.

In some embodiments, the plurality of bit line contacts are formed of aluminum, copper, tungsten, cobalt, or the combination thereof.

In some embodiments, the plurality of bit lines are formed of aluminum or copper.

Another aspect of the present disclosure provides a semiconductor device including a substrate, a plurality of undoped segments positioned above the substrate, a plurality of insulating segments corresponingly selectively positioned on the plurality of undoped segments, and a plurality of capacitor structures positioned between adjacent pairs of the plurality of insulating segments.

In some embodiments, the plurality of undoped segments are formed of silicon oxide, undoped silica glass, borosilica glass, phosphosilica glass, or borophosphosilica glass.

Due to the design of the semiconductor device and fabrication method of the semiconductor device of the present disclosure, the plurality of insulating segments may provide sufficient support for the plurality of capacitor structures and prevent the plurality of capacitor structures from collapsing.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
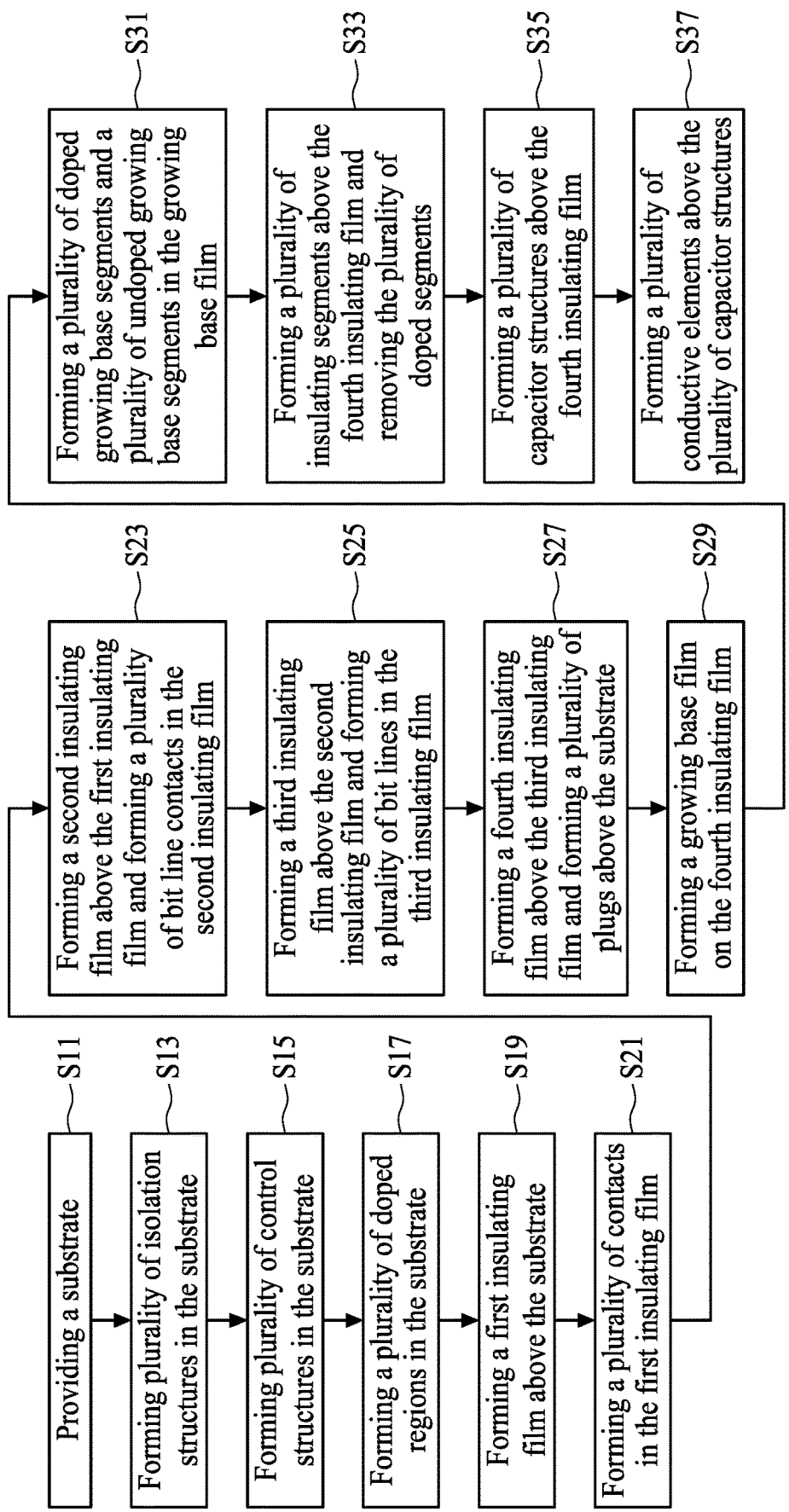
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to," or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

Note that, in the description of the present disclosure, above (or up) corresponds to the direction of the arrow of the direction Z, and below (or down) corresponds to the opposite direction of the arrow of the direction Z.

Figure 2:
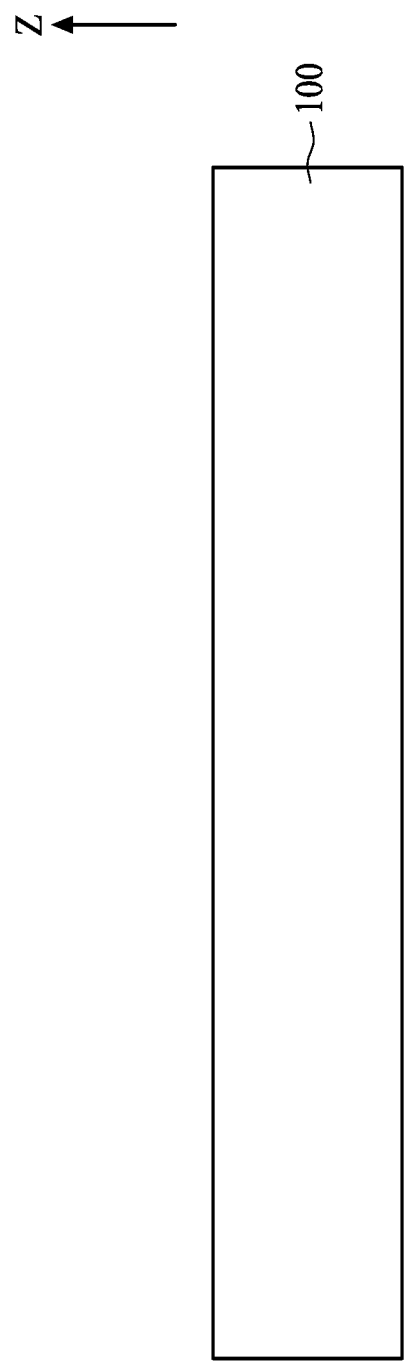
FIGS. 2 to 3 illustrate, in schematic cross-sectional diagrams, part of a flow of fabricating a semiconductor device in accordance with one embodiment of the present disclosure.
Figure 3:
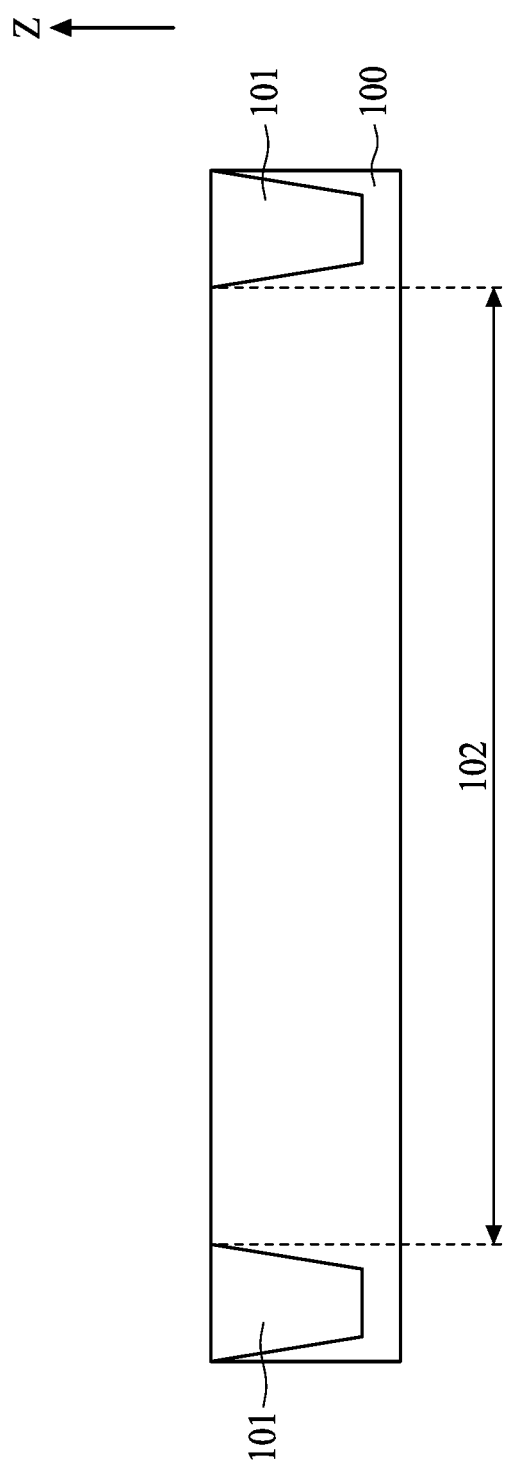
Figure 4:
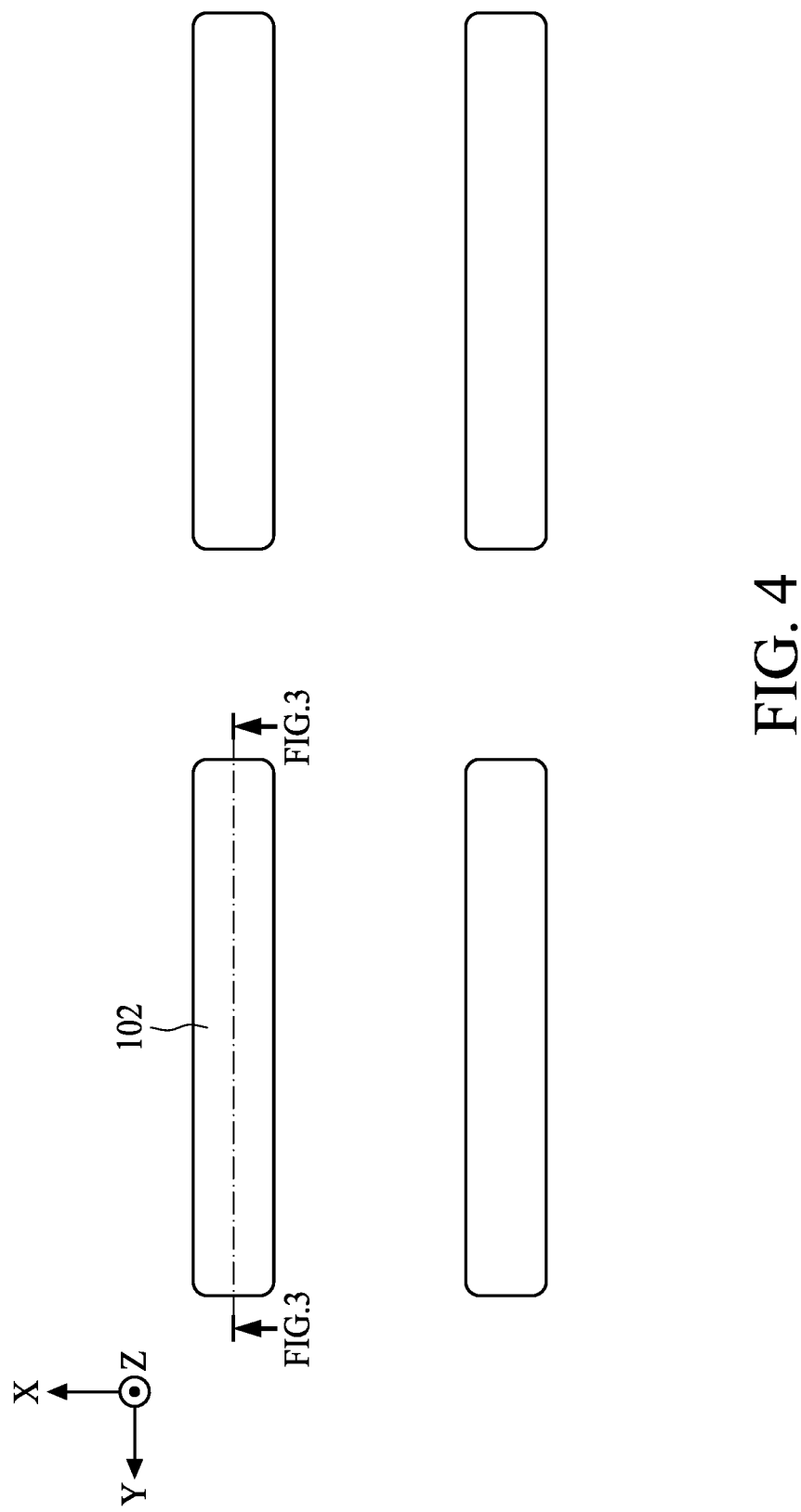
FIG. 4 illustrates, in a schematic top-view diagram, the semiconductor device in accordance with FIG. 3.

FIG. 1 illustrates, in a flowchart diagram form, a method for fabricating a semiconductor device in accordance with one embodiment of the present disclosure. FIGS. 2 and 3 illustrate, in schematic cross-sectional diagrams, part of a flow of fabricating a semiconductor device in accordance with one embodiment of the present disclosure. FIG. 4 illustrates, in a schematic top-view diagram, the semiconductor device in accordance with FIG. 3.

With reference to FIG. 1 and FIG. 2, at step S11, a substrate 100 may be provided. The substrate 100 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, or indium gallium phosphide.

With reference to FIG. 1, FIG. 3, and FIG. 4, at step S13, a plurality of isolation structures 101 may be formed in the substrate 100. The plurality of isolation structures 101 are separated from each other and define a plurality of active regions 102. Each of the plurality of active regions 102 may have a bar shape which extends in a direction Y in a plan view. The plurality of active regions 102 may be parallel to each other. The plurality of isolation structures 101 may be formed of, for example, an insulating material such as silicon oxide, silicon nitride, silicon oxynitride, silicon nitride oxide, fluoride-doped silicate, or the like. Note that the plurality of isolation structures 101 are not shown in FIG. 4 for simplicity.

Note that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 5:
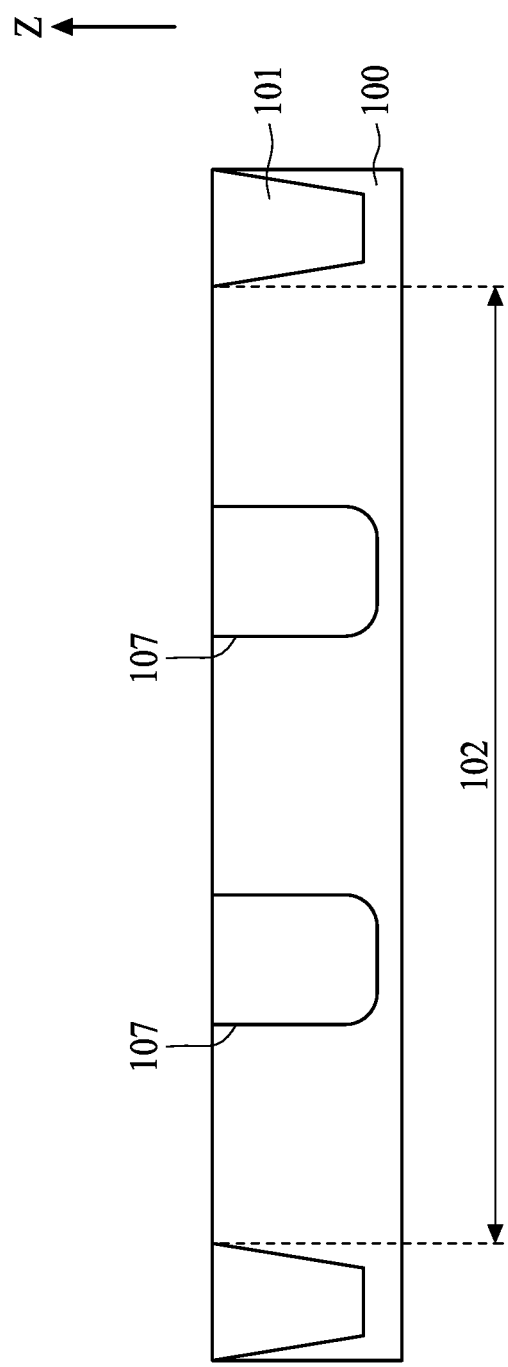
FIGS. 5 to 7 illustrate, in schematic cross-sectional diagrams, part of the flow of fabricating the semiconductor device in accordance with one embodiment of the present disclosure.
Figure 6:
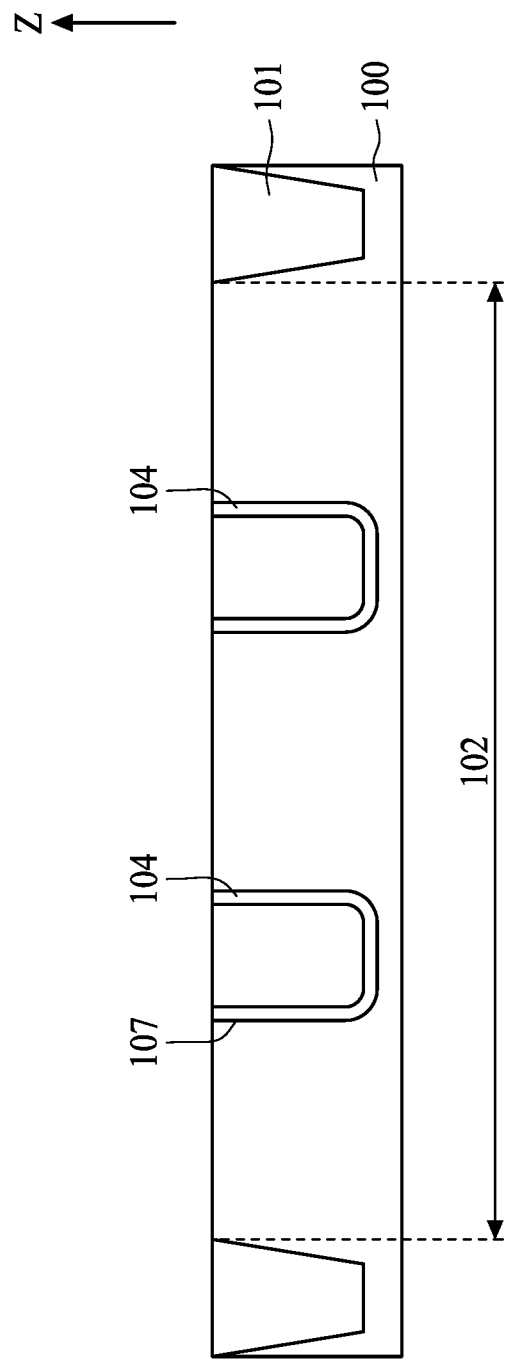
Figure 7:
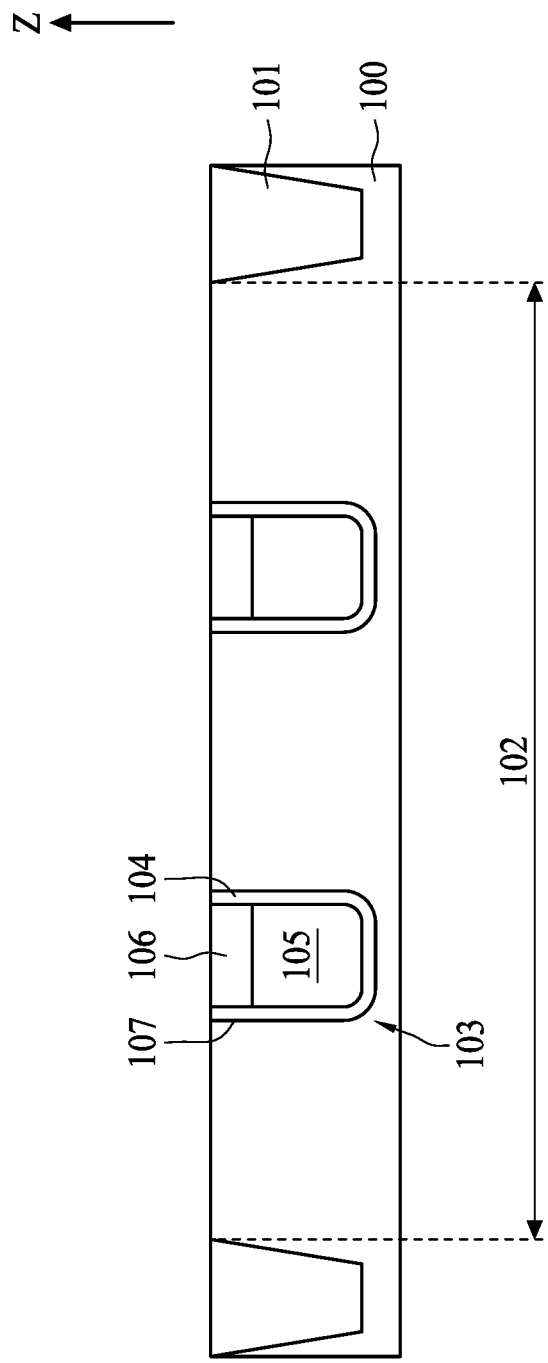
Figure 8:
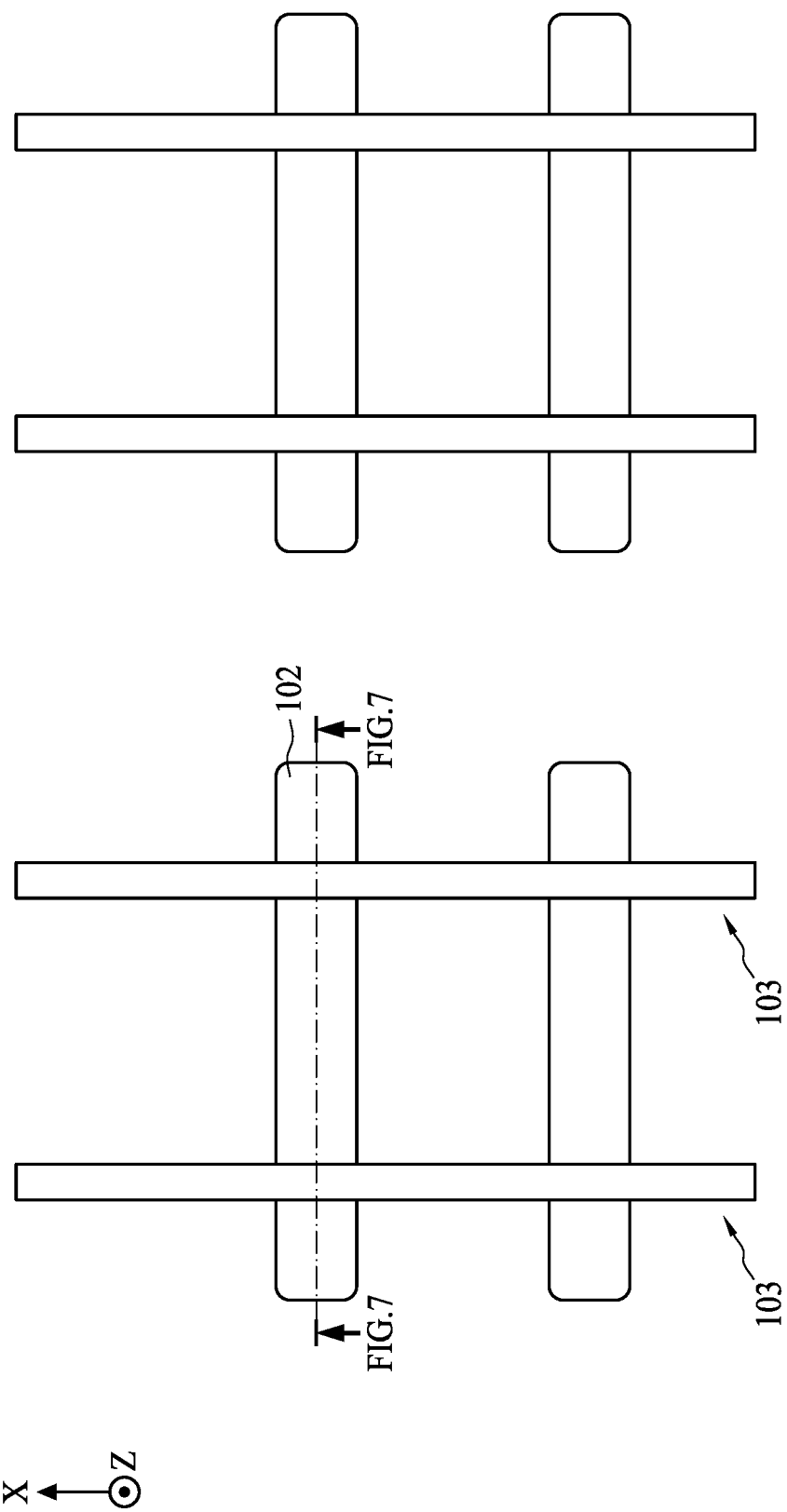
FIG. 8 illustrates, in a schematic top-view diagram, the semiconductor device in accordance with FIG. 7.

FIGS. 5 to 7 illustrate, in schematic cross-sectional diagrams, part of the flow of fabricating the semiconductor device in accordance with one embodiment of the present disclosure. FIG. 8 illustrates, in a schematic top-view diagram, the semiconductor device in accordance with FIG. 7.

With reference to FIG. 1, and FIGS. 5 to 8, at step S15, a plurality of control structures 103 may be formed in the substrate 100. In the embodiment depicted, each of the plurality of control structures 103 includes a bottom layer 104, a middle layer 105, a top layer 106, and a trench opening 107.

With reference to FIG. 5, in the embodiment depicted, an etch process, such as an anisotropic dry etch process, may be performed to form the plurality of trench openings 107 in the substrate 100. With reference to FIG. 6, after the etch process, the plurality of bottom layers 104 may be correspondingly formed on and attached to sidewalls of the plurality of trench openings 107 and bottoms of the plurality of trench openings 107. The plurality of bottom layers 104 may be formed of, for example, silicon oxide, silicon oxynitride, silicon nitride oxide, silicon nitride, or the like.

With reference to FIG. 7, the plurality of middle layers 105 may be correspondingly formed on the plurality of bottom layers 104. Top surfaces of the plurality of middle layers 105 may be lower than a top surface of the substrate 100. The plurality of middle layers 105 may be formed of, for example, doped polysilicon, metal material, or metal silicide. Metal silicide may be, for example, nickel silicide, platinum silicide, titanium silicide, molybdenum silicide, cobalt silicide, tantalum silicide, tungsten silicide, or the like.

With reference to FIG. 7, the plurality of top layers 106 may be correspondingly formed on the plurality of middle layers 105. Top surfaces of the plurality of top layers 106 may be at the same vertical level as the top surface of the substrate 100. The plurality of top layers 106 may be formed of, for example, silicon oxide, silicon oxynitride, silicon nitride oxide, silicon nitride, or the like.

FIGS. 9 to 13 illustrate, in schematic cross-sectional diagrams, part of the flow of fabricating the semiconductor device in accordance with one embodiment of the present disclosure. FIG. 14 illustrates, in a schematic top-view diagram, the semiconductor device in accordance with FIG. 12 and FIG. 13.

Figure 9:
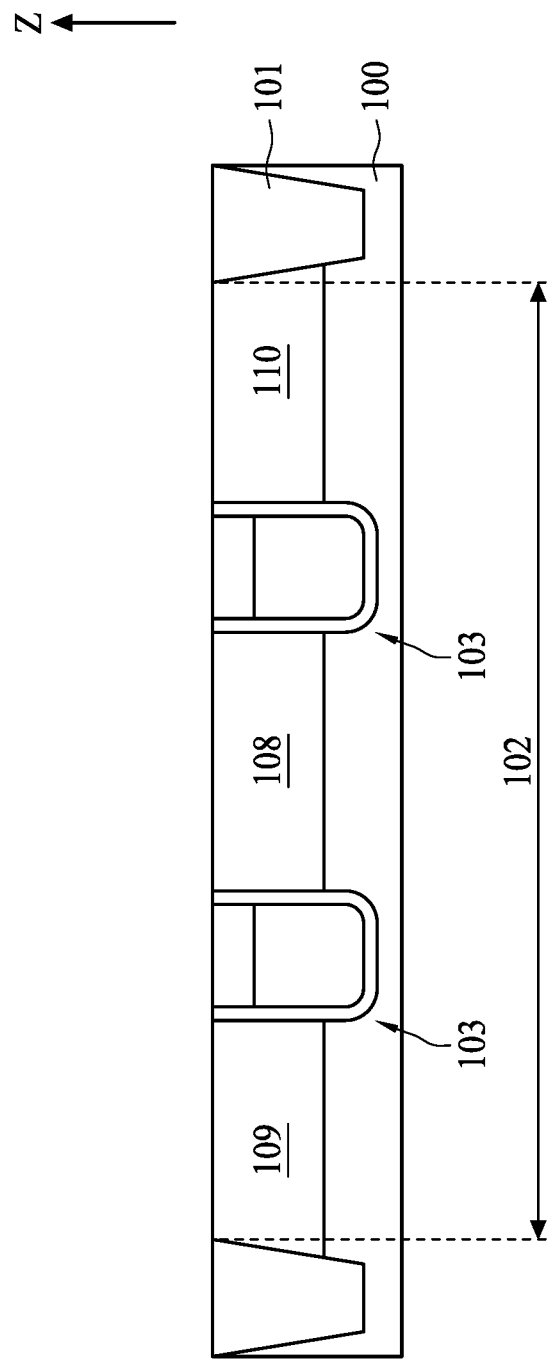
FIGS. 9 to 13 illustrate, in schematic cross-sectional diagrams, part of the flow of fabricating the semiconductor device in accordance with one embodiment of the present disclosure.

With reference to FIG. 1 and FIG. 9, at step S17, a plurality of doped regions may be formed in the substrate 100. The plurality of doped regions include a first doped region 108, a second doped region 109, and a third doped region 110. The first doped region 108 is disposed between an adjacent pair of the plurality of control structures 103. The second doped region 109 is disposed between one of the plurality of isolation structures 101 and one of the adjacent pair of the plurality of control structures 103. The third doped region 110 is disposed between another one of the plurality of isolation structures 101 and another one of the adjacent pair of the plurality of control structures 103. The first doped region 108, the second doped region 109, and the third doped region 110 are respectively doped by a dopant such as phosphorus, arsenic, or antimony. Each of the first doped region 108, the second doped region 109, and the third doped region 110 has a dopant concentration ranging from about 1E17 atoms/cm$^3$ to about 1E19 atoms/cm$^3$. The plurality of control structures 103, the plurality of isolation structures 101, and the plurality of doped regions 108 and 109 together form a plurality of semiconductor elements.

Figure 10:
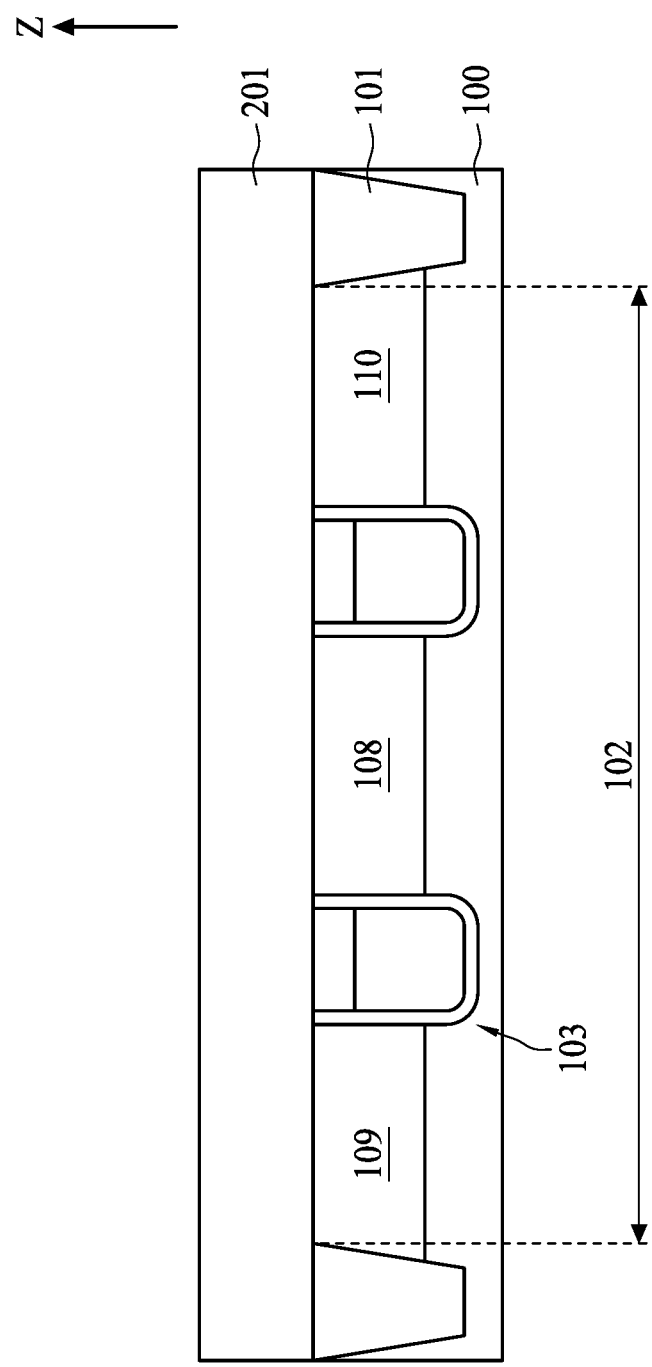

With reference to FIG. 1 and FIG. 10, at step S19, a first insulating film 201 may be formed on the substrate 100. The first insulating film 201 may be formed of, for example, silicon nitride, silicon oxide, silicon oxynitride, undoped silica glass, borosilica glass, phosphosilica glass, borophosphosilica glass, or a combination thereof, but is not limited thereto.

Figure 11:
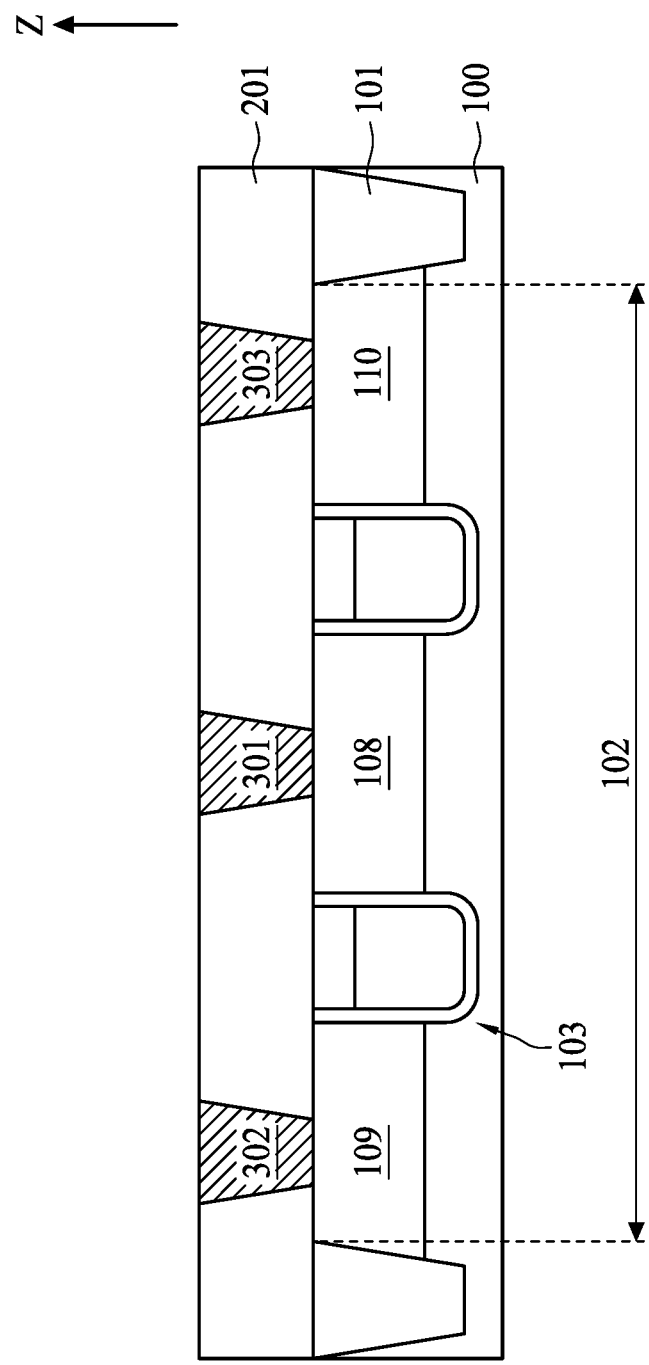
Figure 12:
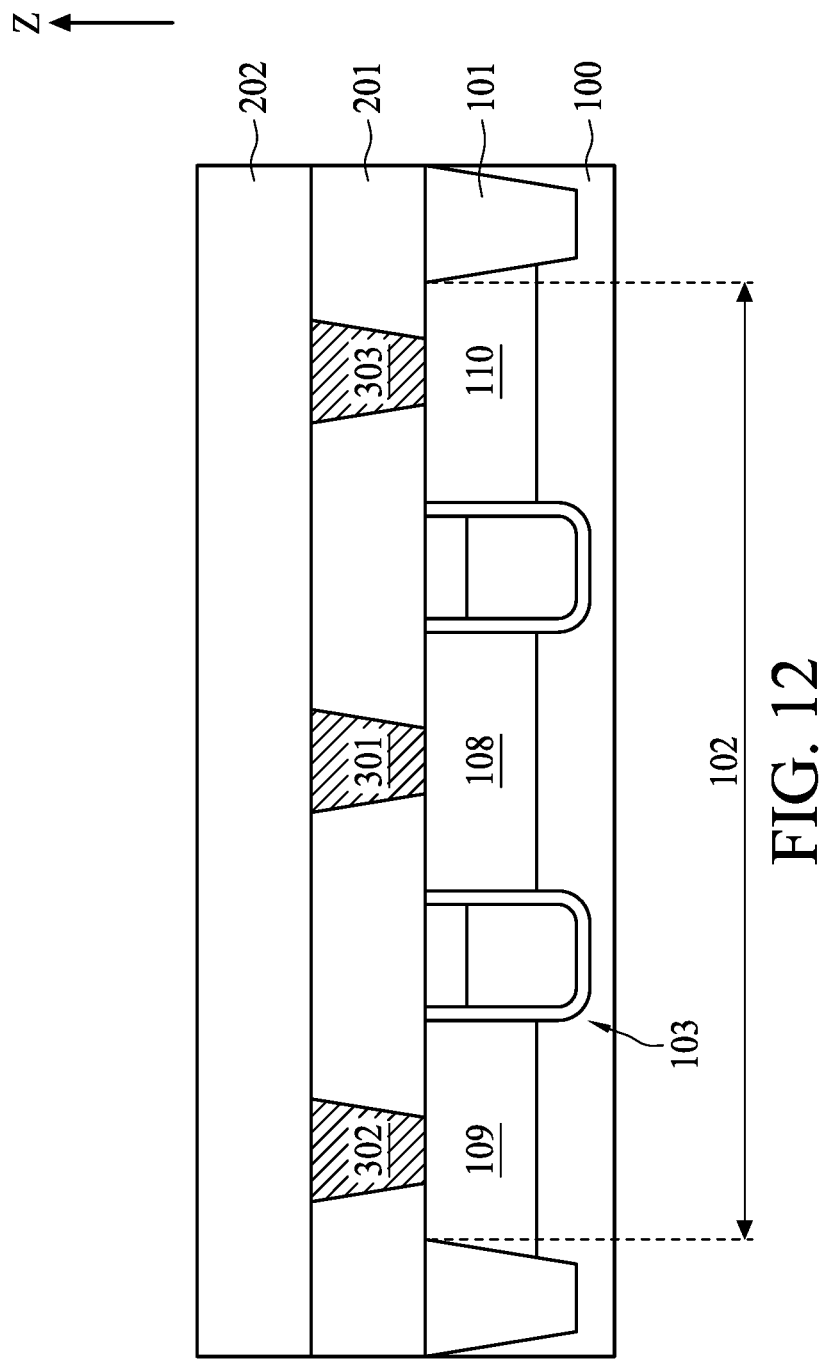

With reference to FIG. 1 and FIG. 11, at step S21, a plurality of contacts may be formed in the first insulating film 201. A photolithography process may be used to pattern the first insulating film 201 to define positions of the plurality of contacts. An etch process, such as an anisotropic dry etch process, may be performed after the photolithography process to form a plurality of contact openings in the first insulating film 201. After the etch process, a conductive material, for example, aluminum, copper, tungsten, cobalt, or other suitable metal or metal alloy, is deposited, by a metallization process such as chemical vapor deposition, physical vapor deposition, sputtering, or the like, in the plurality of contact openings to form the plurality of contacts. A planarization process, such as chemical mechanical polishing, may be performed after the metallization process to remove excess deposited material and provide a substantially flat surface for subsequent processing steps. Additionally, a plurality of barrier layers (not shown) may be respectively formed on sidewalls and bottoms of the plurality of contact openings prior to the metallization process. The plurality of barrier layers may be formed of titanium, titanium nitride, titanium-tungsten alloy, tantalum, tantalum nitride, or a combination thereof, and may be formed by physical vapor deposition, sputtering, or the like.

With reference to FIG. 11, the plurality of contacts include a first contact 301, a second contact 302, and a third contact 303. The first contact 301 is disposed on the first doped region 108 and is electrically connected to the first doped region 108. The second contact 302 is disposed on the second doped region 109 and is electrically connected to the second doped region 109. The second contact 302 is opposite to the first contact 301. The third contact 303 is disposed on the third doped region 110 and is electrically connected to the third doped region 110. The third contact 303 is opposite to the second contact 302 with the first contact 301 interposed therebetween.

With reference to FIG. 1 and FIGS. 12 to 14, at step S23, a second insulating film 202 may be formed on the first insulating film 201 and a plurality of bit line contacts 304 may be formed in the second insulating film 202. A photolithography process may be used to pattern the second insulating film 202 to define positions of the plurality of bit line contacts 304. An etch process, such as an anisotropic dry etch process, may be performed after the photolithography process to form a plurality of bit line contact openings in the second insulating film 202. After the etch process, a conductive material, for example, aluminum, copper, tungsten, cobalt, or other suitable metal or metal alloy, is deposited, by a metallization process such as chemical vapor deposition, physical vapor deposition, sputtering, or the like, in the plurality of contact openings to form the plurality of bit line contacts 304. A planarization process, such as chemical mechanical polishing, may be performed after the metallization process to remove excess deposited material and provide a substantially flat surface for subsequent processing steps. The second insulating film 202 may be formed of, for example, silicon nitride, silicon oxide, silicon oxynitride, undoped silica glass, borosilica glass, phosphosilica glass, borophosphosilica glass, or a combination thereof, but is not limited thereto. Additionally, a plurality of barrier layers (not shown) may be respectively formed on sidewalls and bottoms of the plurality of bit line contact openings prior to the metallization process. The plurality of barrier layers may be formed of titanium, titanium nitride, titanium-tungsten alloy, tantalum, tantalum nitride, or the combination thereof, and may be formed by physical vapor deposition, sputtering, or the like.

Figure 13:
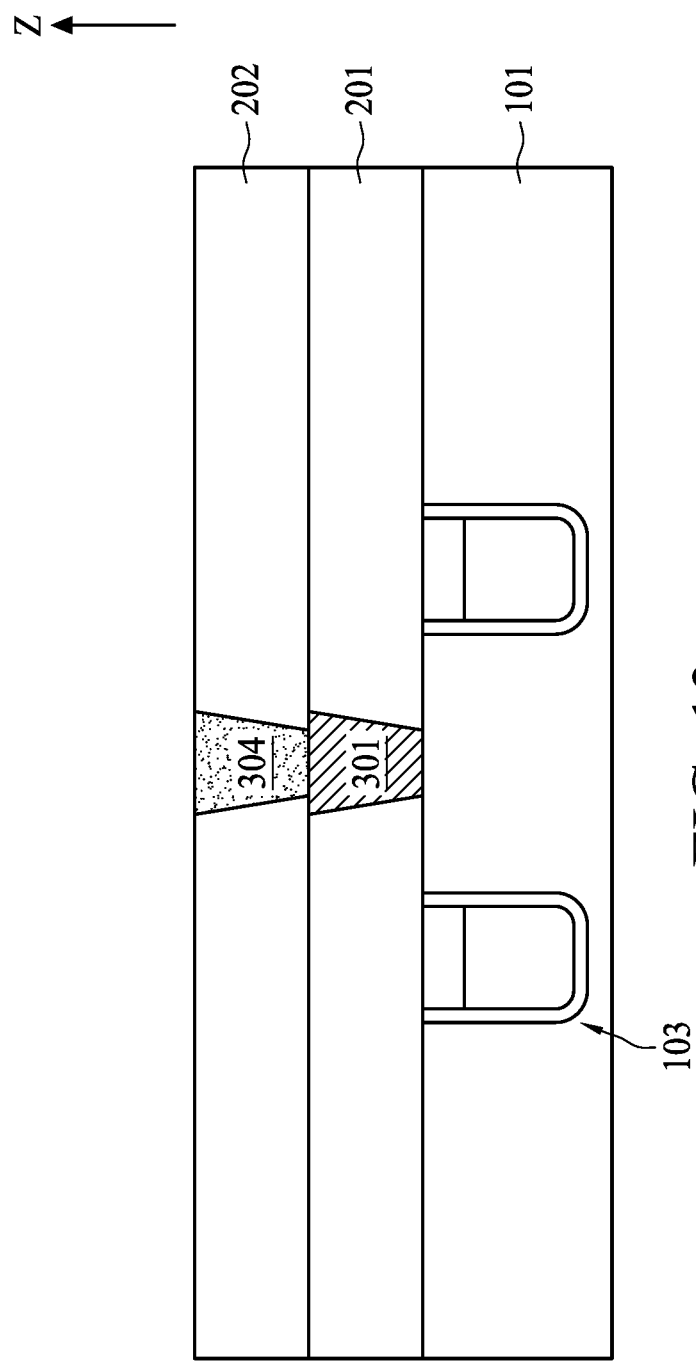
Figure 14:
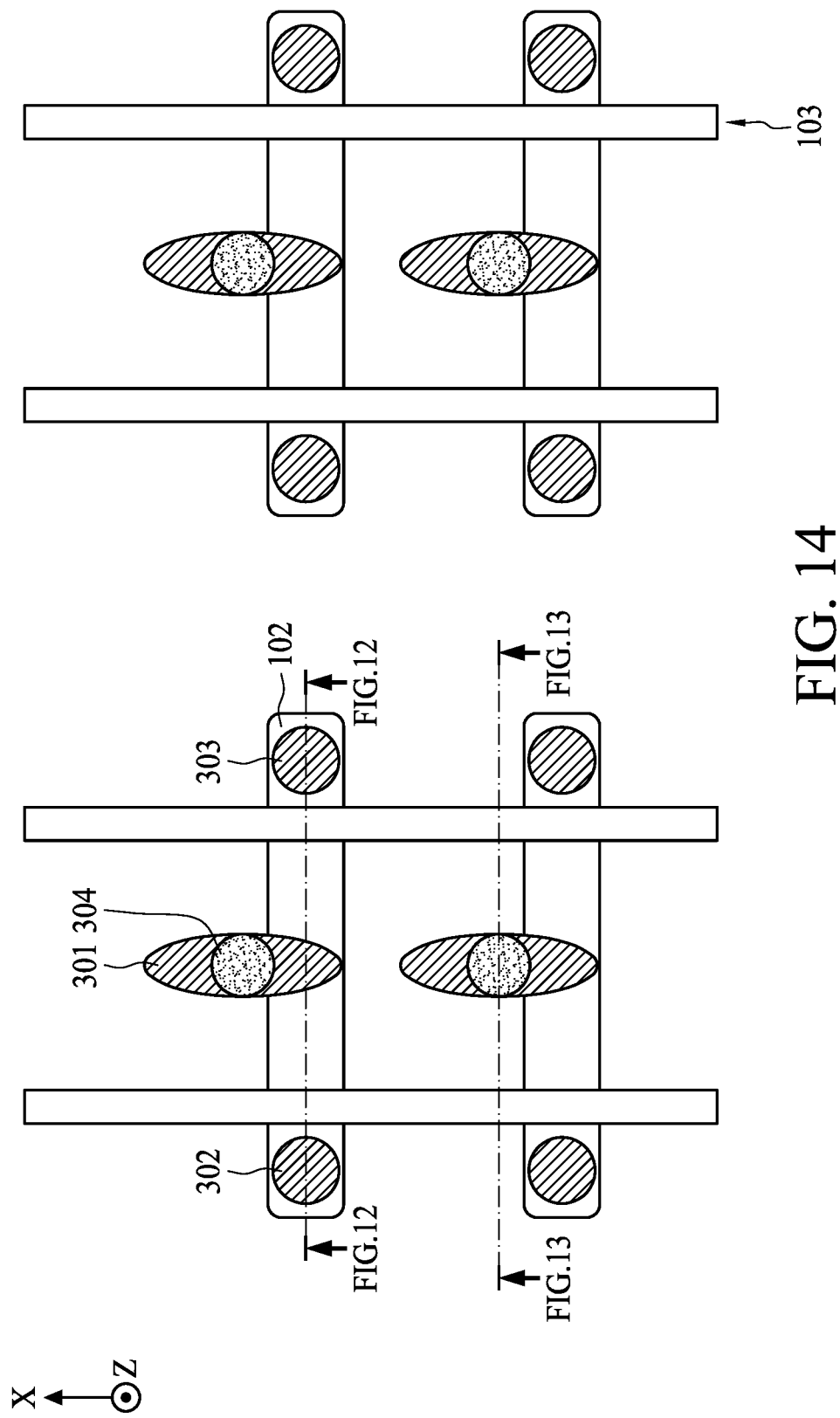
FIG. 14 illustrates, in a schematic top-view diagram, the semiconductor device in accordance with FIG. 12 and FIG. 13.

With reference to FIG. 13, the plurality of bit line contacts 304 are correspondingly electrically connected to the first contact 301; that is, the plurality of bit line contacts 304 are electrically coupled to the first doped region 108.

Note that the plurality of isolation structures 101, the first insulating film 201, and the second insulating film 202 are not shown in FIG. 14 for simplicity.

Figure 15:
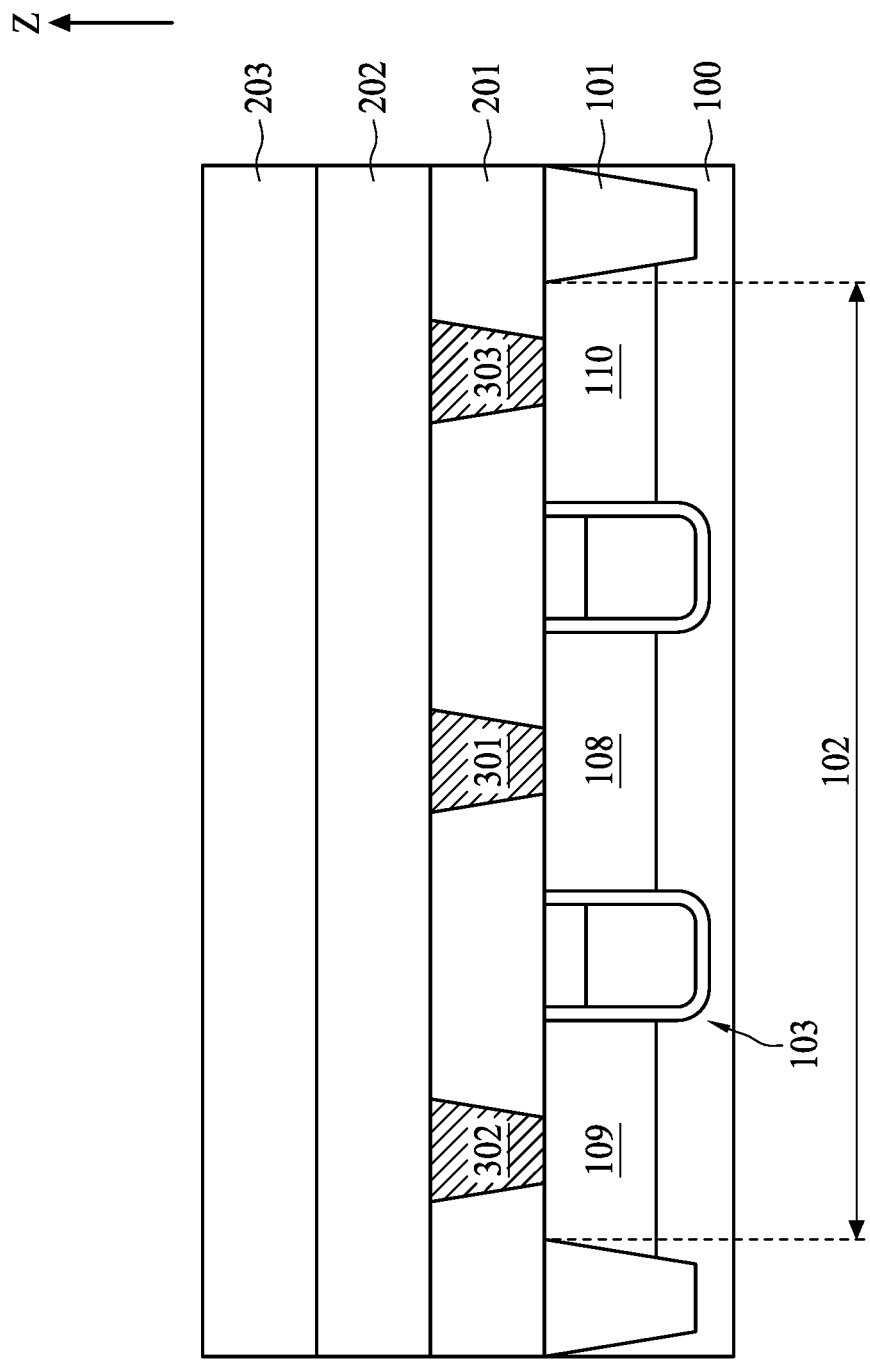
FIG. 15 and FIG. 16 illustrate, in schematic cross-sectional diagrams, part of the flow of fabricating the semiconductor device in accordance with one embodiment of the present disclosure.
Figure 16:
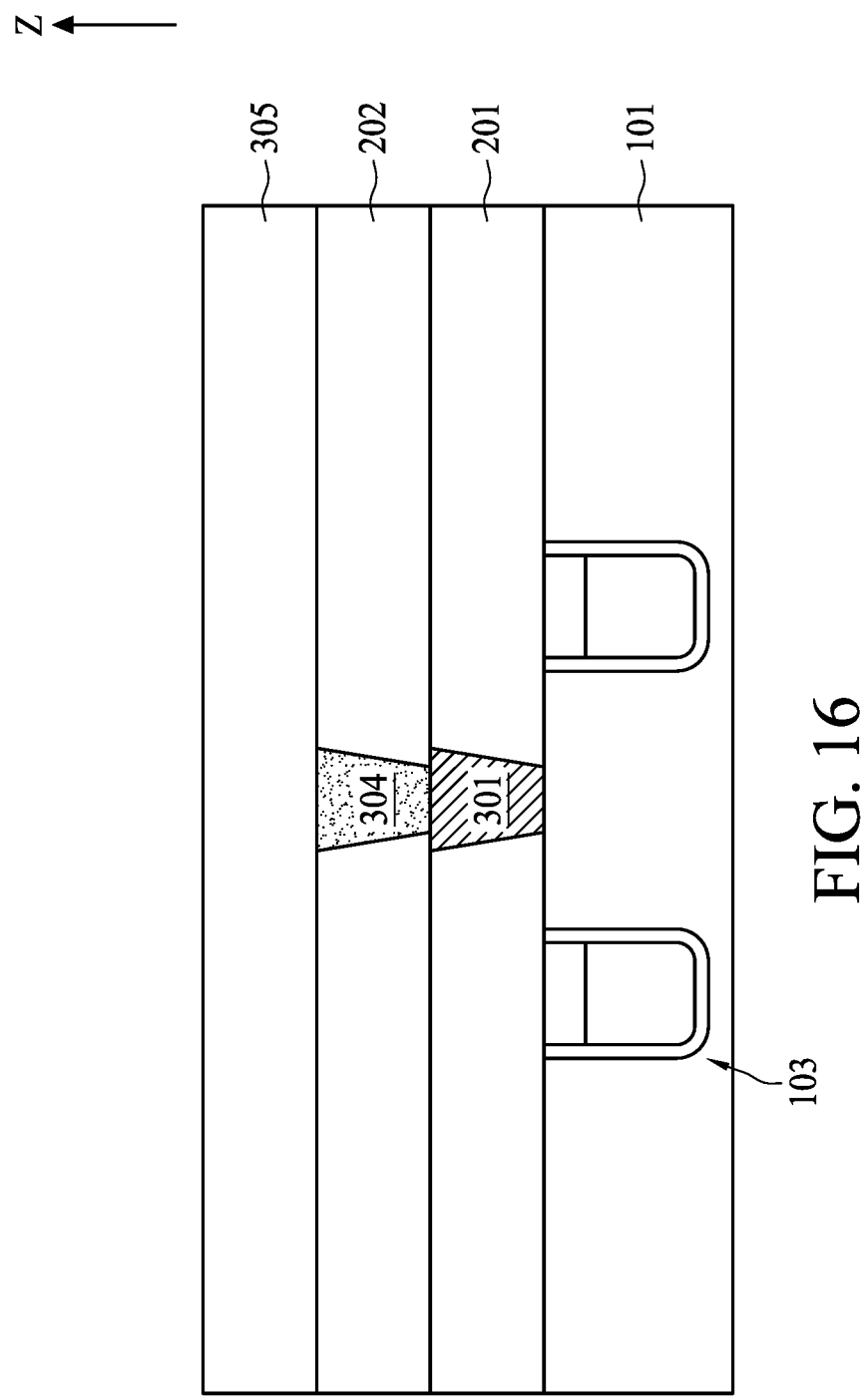
Figure 17:
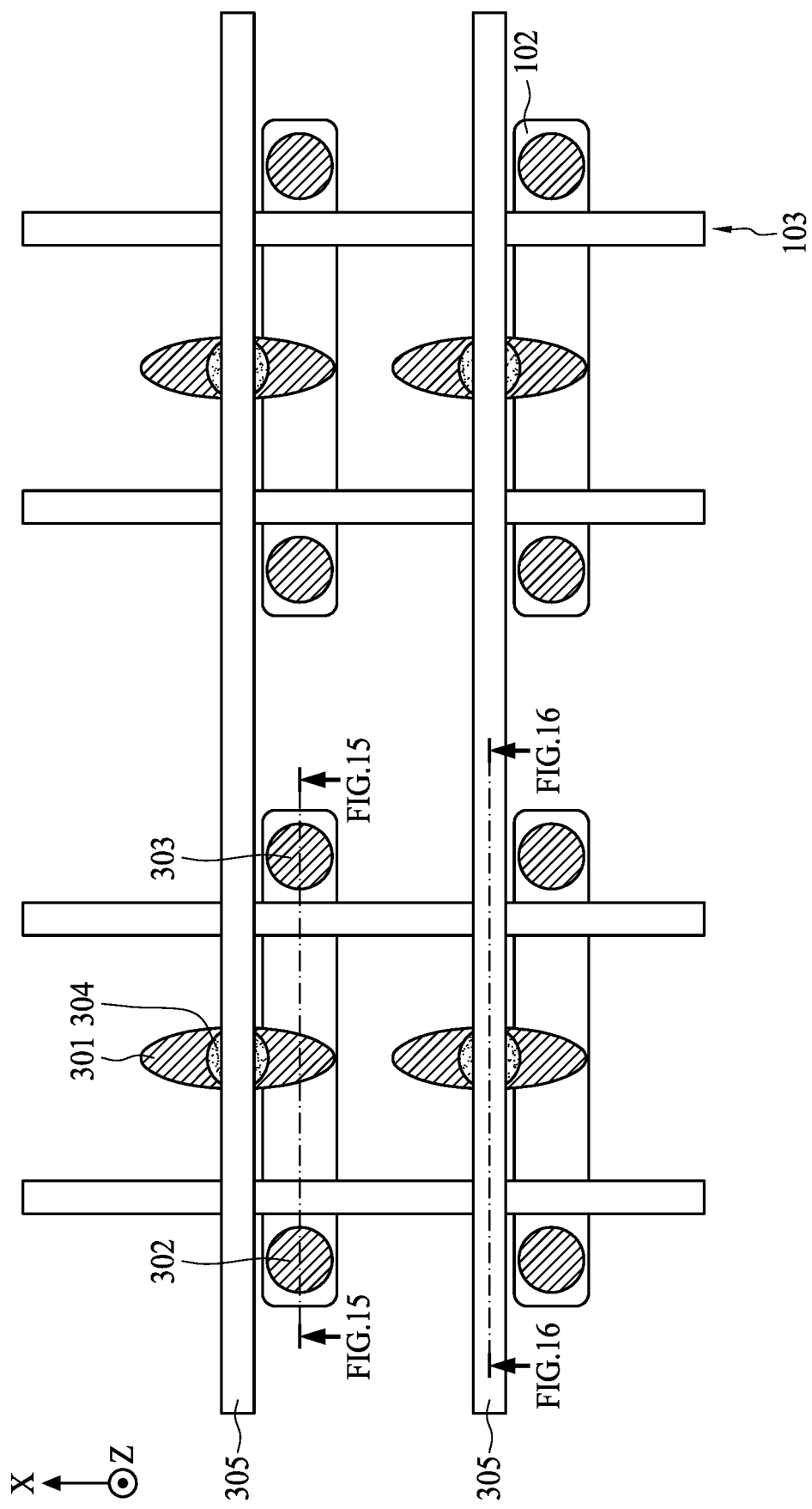
FIG. 17 illustrates, in a schematic top-view diagram, the semiconductor device in accordance with FIG. 15 and FIG. 16.

FIG. 15 and FIG. 16 illustrate, in schematic cross-sectional diagrams, part of the flow of fabricating the semiconductor device in accordance with one embodiment of the present disclosure. FIG. 17 illustrates, in a schematic top-view diagram, the semiconductor device in accordance with FIG. 15 and FIG. 16.

With reference to FIG. 1 and FIGS. 15 to 17, at step S25, a third insulating film 203 may be formed on the second insulating film 202 and a plurality of bit lines 305 may be formed in the third insulating film 203. A photolithography process may be used to pattern the third insulating film 203 to define positions of the plurality of bit lines 305. An etch process, such as an anisotropic dry etch process, may be performed after the photolithography process to form a plurality of bit line trench openings in the third insulating film 203. After the etch process, a conductive material, for example, aluminum, copper, tungsten, cobalt, or other suitable metal or metal alloy, is deposited, by a metallization process such as chemical vapor deposition, physical vapor deposition, sputtering, or the like, in the plurality of bit line trench openings to form the plurality of bit lines 305. A planarization process, such as chemical mechanical polishing, may be performed after the metallization process to remove excess deposited material and provide a substantially flat surface for subsequent processing steps. The third insulating film 203 may be formed of, for example, silicon nitride, silicon oxide, silicon oxynitride, undoped silica glass, borosilica glass, phosphosilica glass, borophosphosilica glass, or a combination thereof, but is not limited thereto. Additionally, a plurality of barrier layers (not shown) may be respectively formed on sidewalls and bottoms of the plurality of bit line trench openings prior to the metallization process. The plurality of bather layers may be formed of titanium, titanium nitride, titanium-tungsten alloy, tantalum, tantalum nitride, or the combination thereof, and may be formed by physical vapor deposition, sputtering, or the like.

With reference to FIG. 16 and FIG. 17, the plurality of bit lines 305 are correspondingly electrically connected to the plurality of bit line contacts 304. The plurality of bit lines 305 do not overlap the active region 102.

Note that the plurality of isolation structures 101, the first insulating film 201, the second insulating film 202, and the third insulating film 203 are not shown in FIG. 17 for simplicity.

Figure 18:
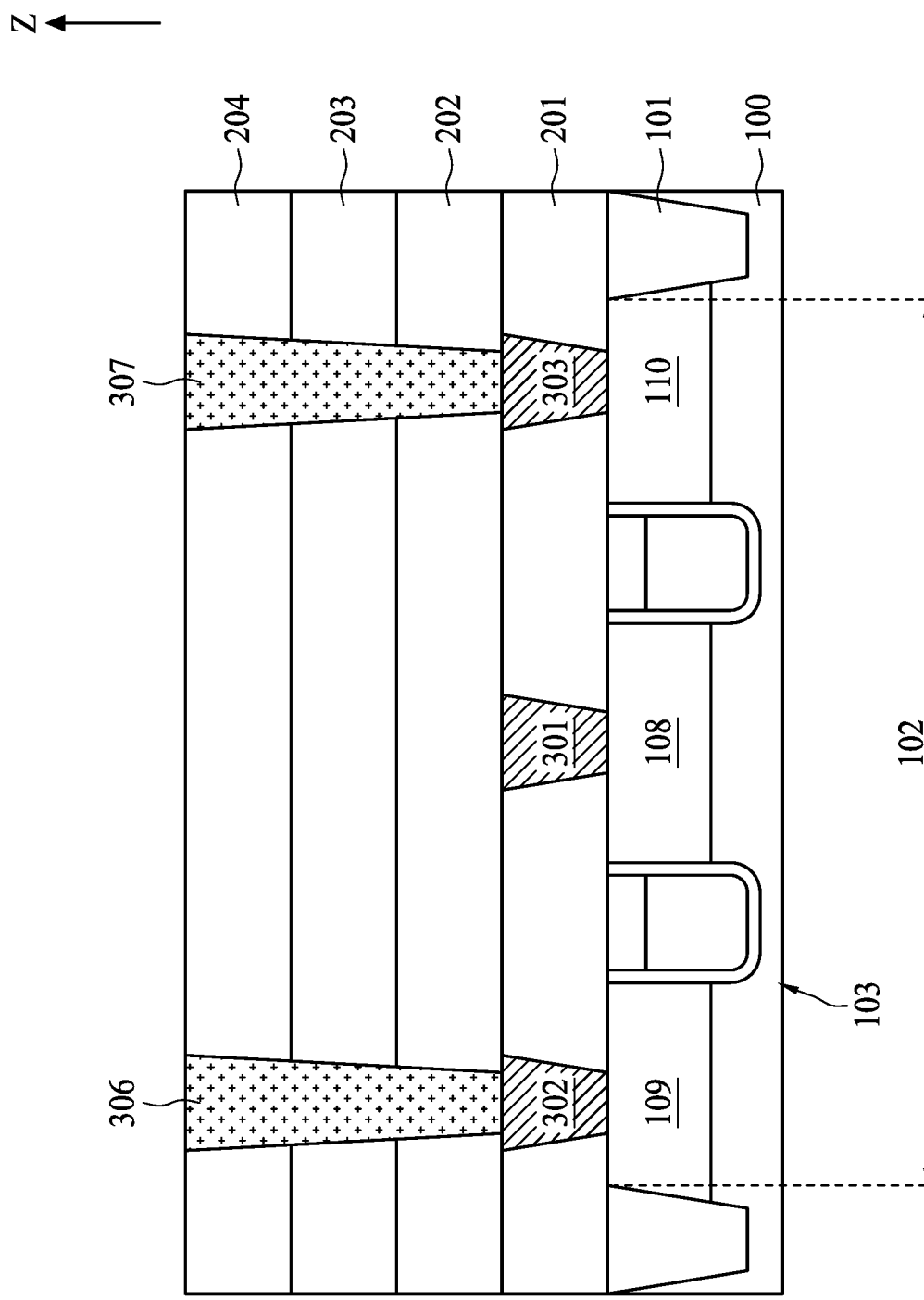
FIG. 18 illustrates, in a schematic cross-sectional diagram, part of the flow of fabricating the semiconductor device in accordance with one embodiment of the present disclosure.
Figure 19:
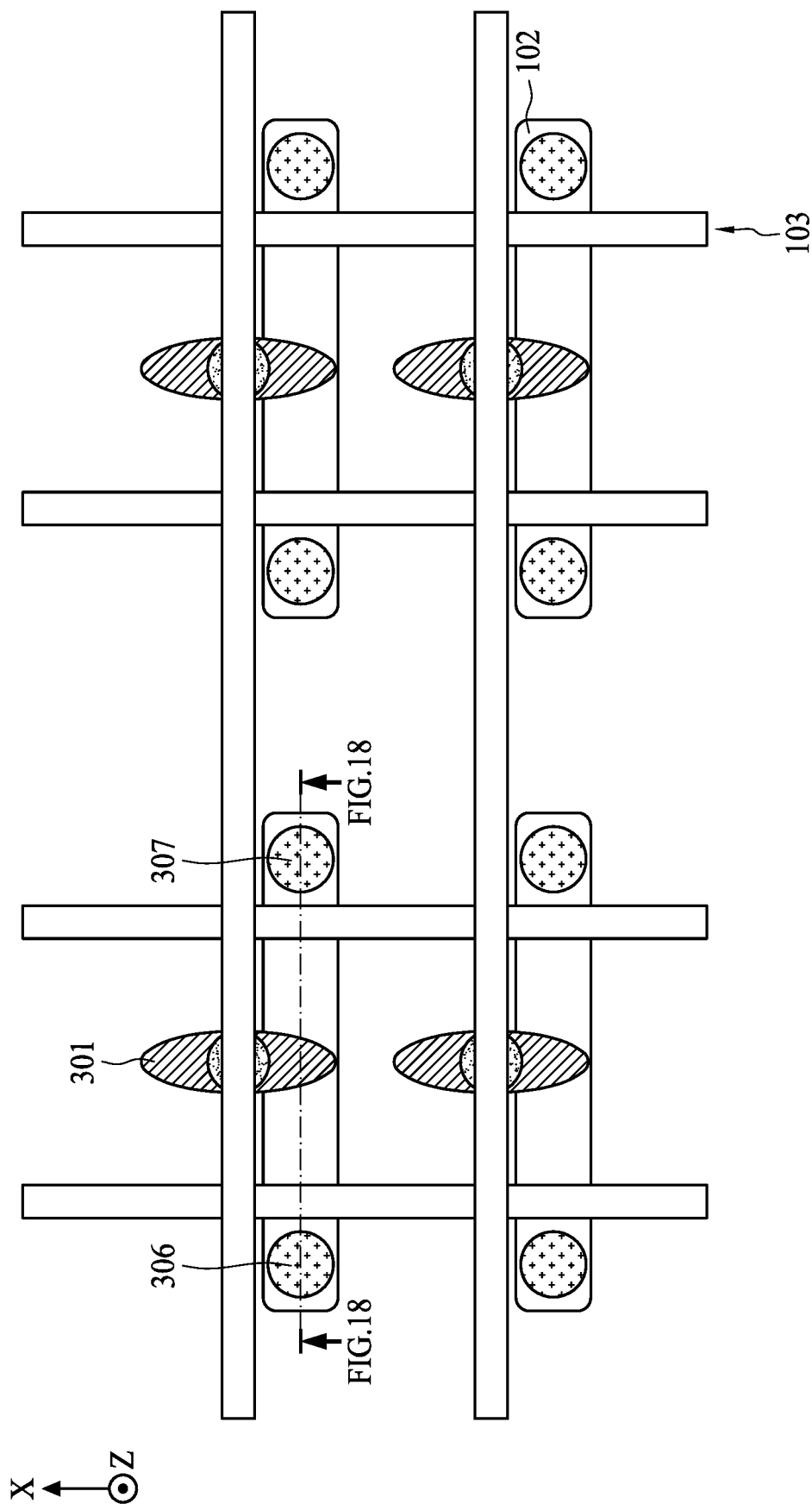
FIG. 19 illustrates, in a schematic top-view diagram, the semiconductor device in accordance with FIG. 18.

FIG. 18 illustrates, in a schematic cross-sectional diagram, part of the flow of fabricating the semiconductor device in accordance with one embodiment of the present disclosure. FIG. 19 illustrates, in a schematic top-view diagram, the semiconductor device in accordance with FIG. 18.

With reference to FIG. 1, FIG. 18, and FIG. 19, at step S27, a fourth insulating film 204 may be formed on the third insulating film 203 and a plurality of plugs may be formed to pass through the fourth insulating film 204, the third insulating film 203, and the second insulating film 202. A photolithography process may be used to pattern the fourth insulating film 204 to define positions of the plurality of plugs. An etch process, such as an anisotropic dry etch process, may be performed after the photolithography process to form a plurality of plug openings passing through the fourth insulating film 204, the third insulating film 203, and the second insulating film 202. After the etch process, a conductive material, for example, aluminum, copper, tungsten, cobalt, or other suitable metal or metal alloy is deposited, by a metallization process such as chemical vapor deposition, physical vapor deposition, sputtering, or the like, in the plurality of plug openings to form the plurality of plugs. A planarization process, such as chemical mechanical polishing, may be performed after the metallization process to remove excess deposited material and provide a substantially flat surface for subsequent processing steps. The fourth insulating film 204 may be formed of, for example, silicon nitride, silicon oxide, silicon oxynitride, undoped silica glass, borosilica glass, phosphosilica glass, borophosphosilica glass, or a combination thereof, but is not limited thereto. Additionally, a plurality of barrier layers (not shown) may be respectively formed on sidewalls and bottoms of the plurality of plug openings prior to the metallization process. The plurality of barrier layers may be formed of titanium, titanium nitride, titanium-tungsten alloy, tantalum, tantalum nitride, or the combination thereof, and may be formed by physical vapor deposition, sputtering, or the like.

With reference to FIG. 18 and FIG. 19, the plurality of plugs may include a first plug 306 and a second plug 307. The first plug 306 passes through the fourth insulating film 204, the third insulating film 203, and the second insulating film 202 and is electrically connected to the second contact 302; that is, the first plug 306 is electrically coupled to the second doped region 109. The first plug 306 does not overlap the plurality of bit lines 305. The second plug 307 passes through the fourth insulating film 204, the third insulating film 203, and the second insulating film 202 and is electrically connected to the third contact 303; that is, the second plug 307 is electrically coupled to the third doped region 110. The second plug 307 does not overlap the plurality of bit lines 305.

Note that the plurality of isolation structures 101, the first insulating film 201, the second insulating film 202, the third insulating film 203, and the fourth insulating film 204 are not shown in FIG. 19 for simplicity.

FIGS. 20 to 35 illustrate, in schematic cross-sectional diagrams, part of the flow of fabricating the semiconductor device in accordance with one embodiment of the present disclosure.

Figure 20:
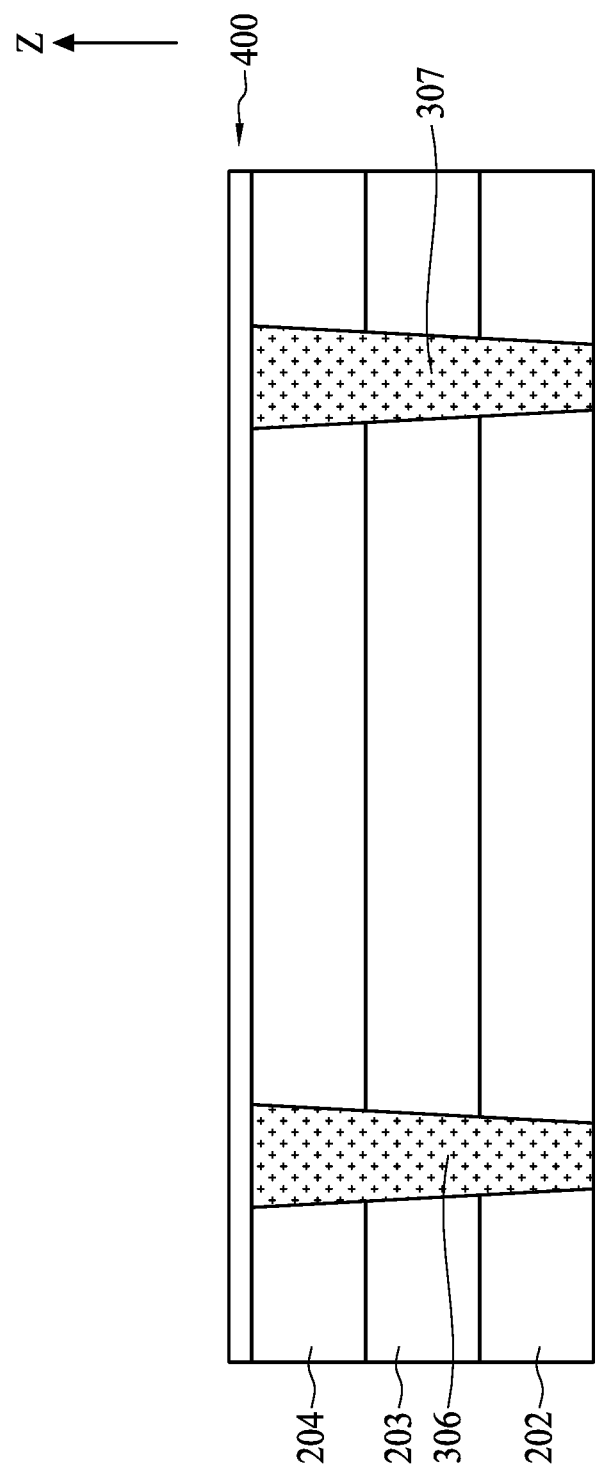
FIGS. 20 to 35 illustrate, in schematic cross-sectional diagrams, part of the flow of fabricating the semiconductor device in accordance with one embodiment of the present disclosure.

With reference to FIG. 1 and FIG. 20, at step S29, a growing base film 400 may be formed on the fourth insulating film 204. A deposition process such as chemical vapor deposition or the like is used to form the growing base film 400. The growing base film may be formed of, for example, an insulating material without nitrogen. The insulating material without nitrogen may be silicon oxide, undoped silica glass, borosilica glass, phosphosilica glass, or borophosphosilica glass.

Figure 21:
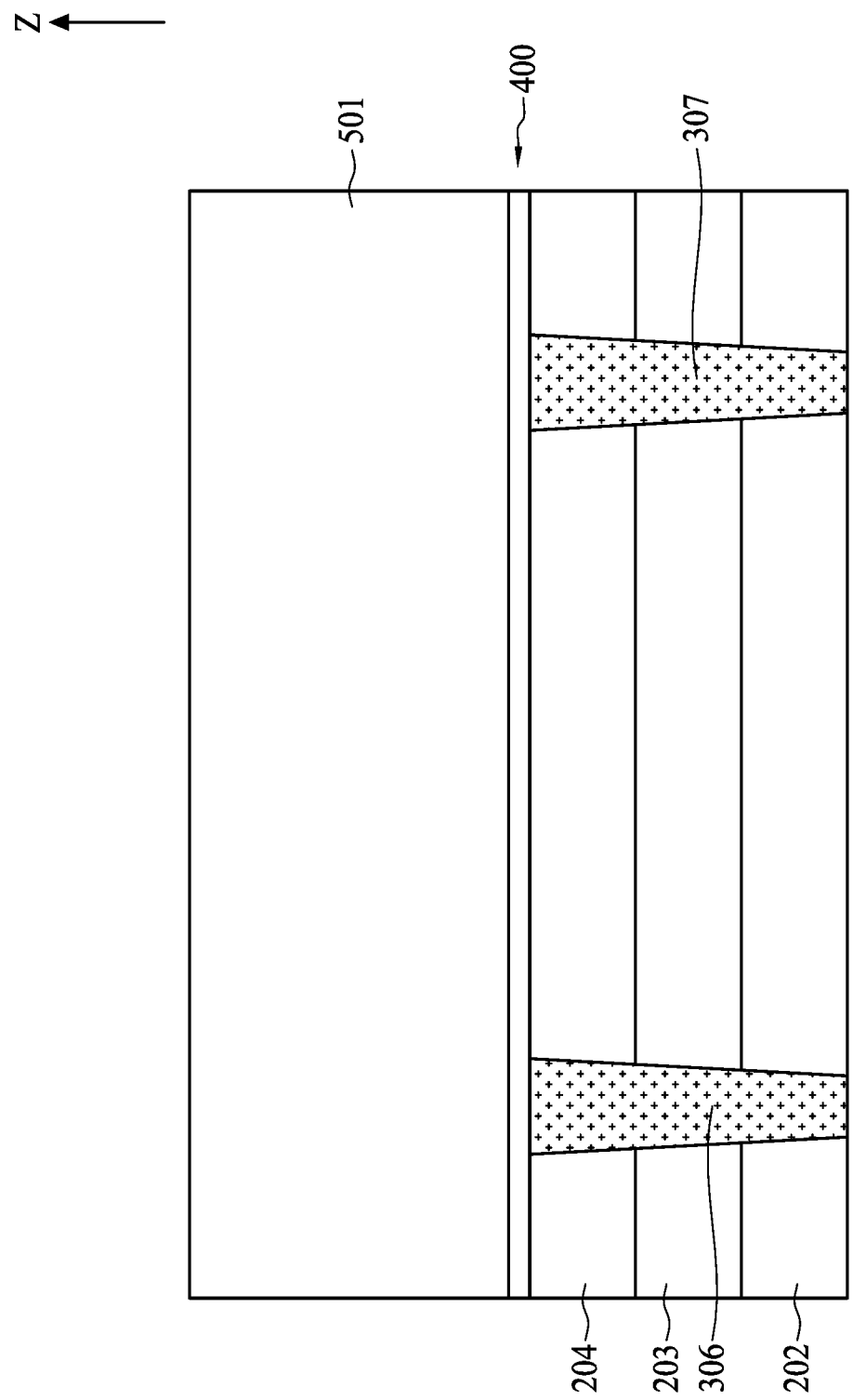
Figure 22:
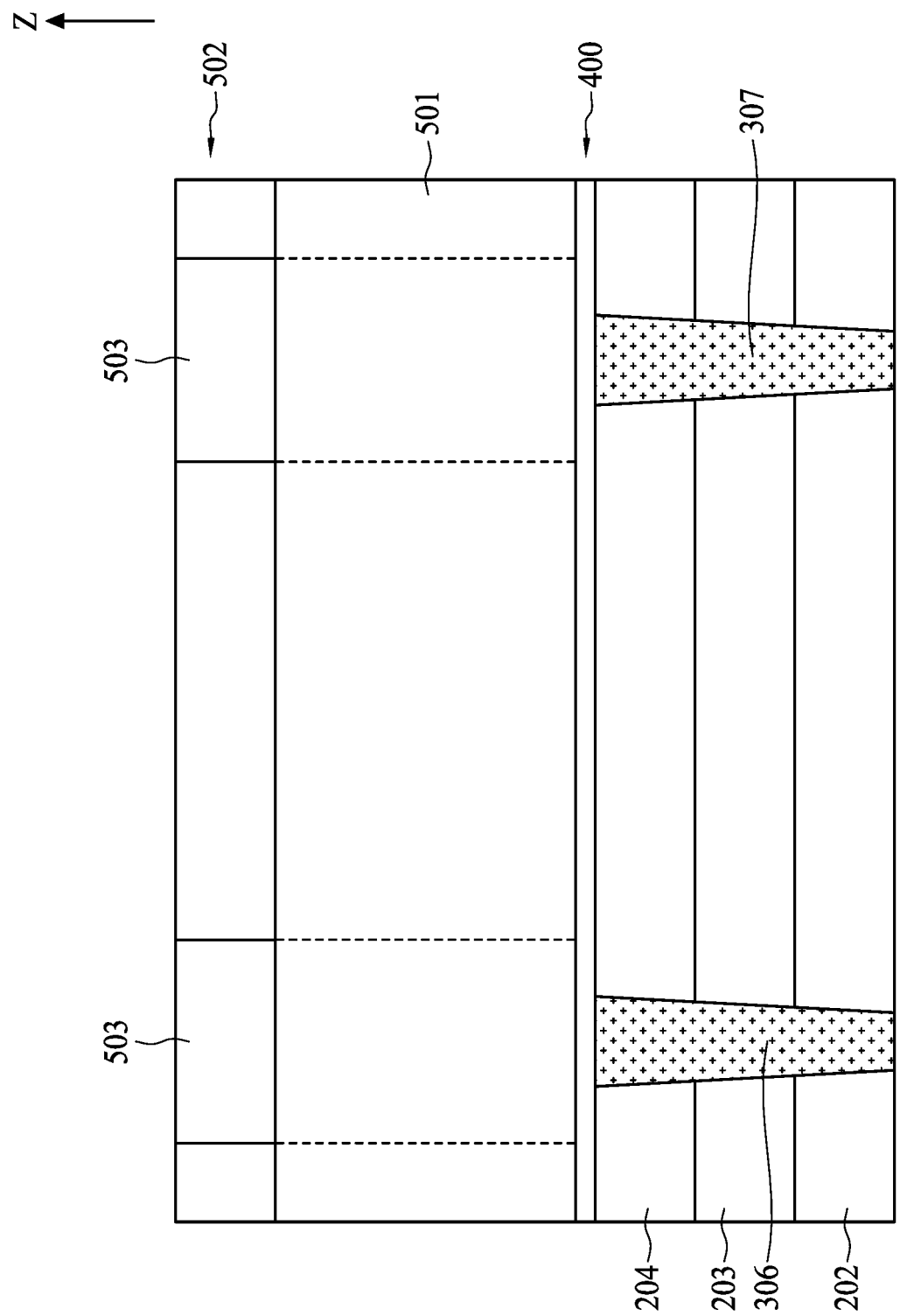
Figure 23:
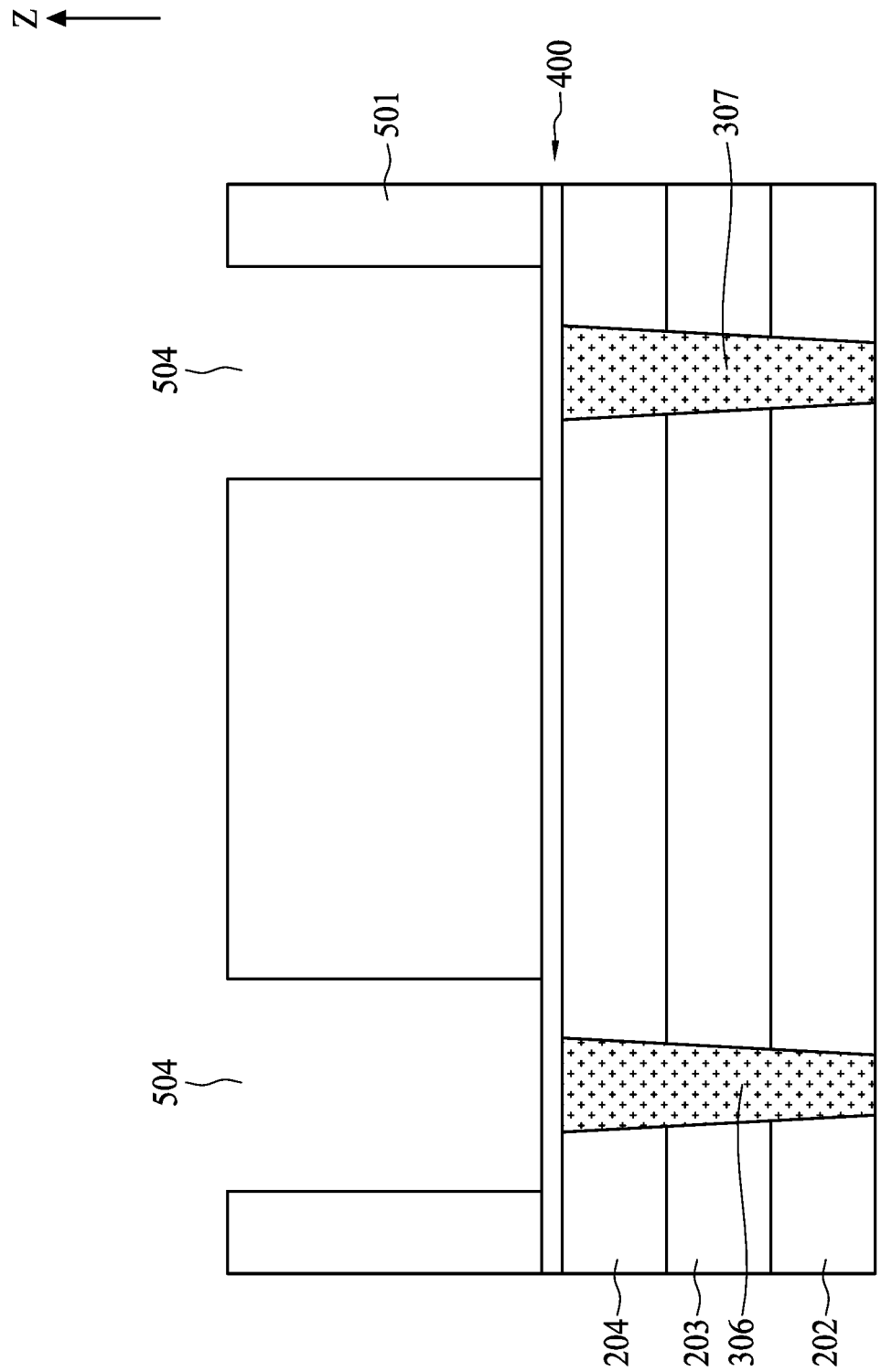

With reference to FIG. 1 and FIGS. 21 to 26, at step S31, a plurality of doped growing base segments 401 and a plurality of undoped growing base segments 402 are formed in the growing base film 400. With reference to FIGS. 21 to 23, in the embodiment depicted, a photoresist layer 501 may be formed on the growing base film 400 and a mask 502 is used to transfer images 503 of the mask 502 to the photoresist layer 501. After the developing of the photoresist layer 501, a plurality of first recesses 504 are formed in the photoresist layer 501. The positions of the plurality of first recesses 504 correspond to the images 503 of the mask 502. Portions of the growing base film 400 are exposed through the plurality of first recesses 504.

Figure 24:
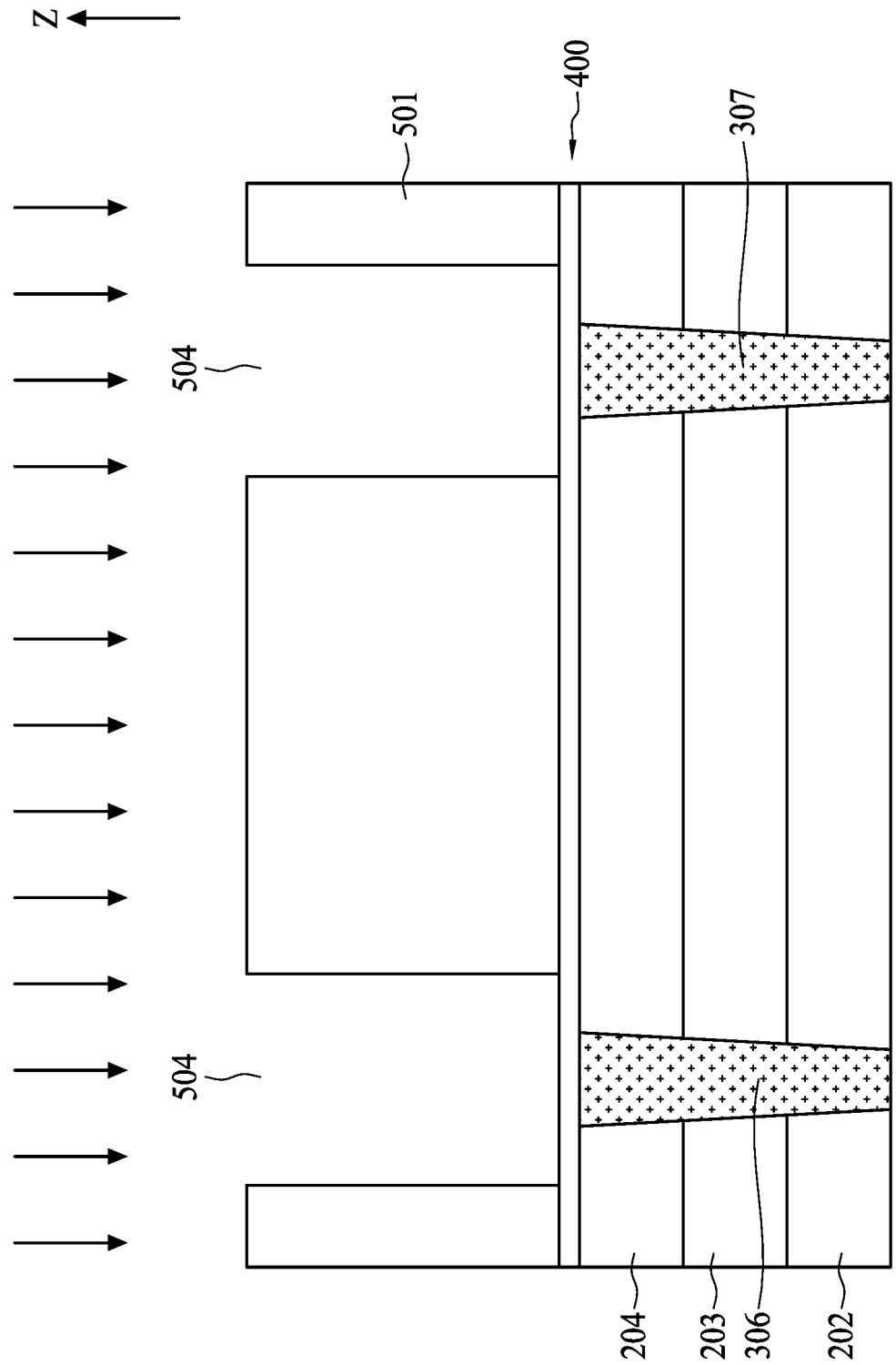
Figure 25:
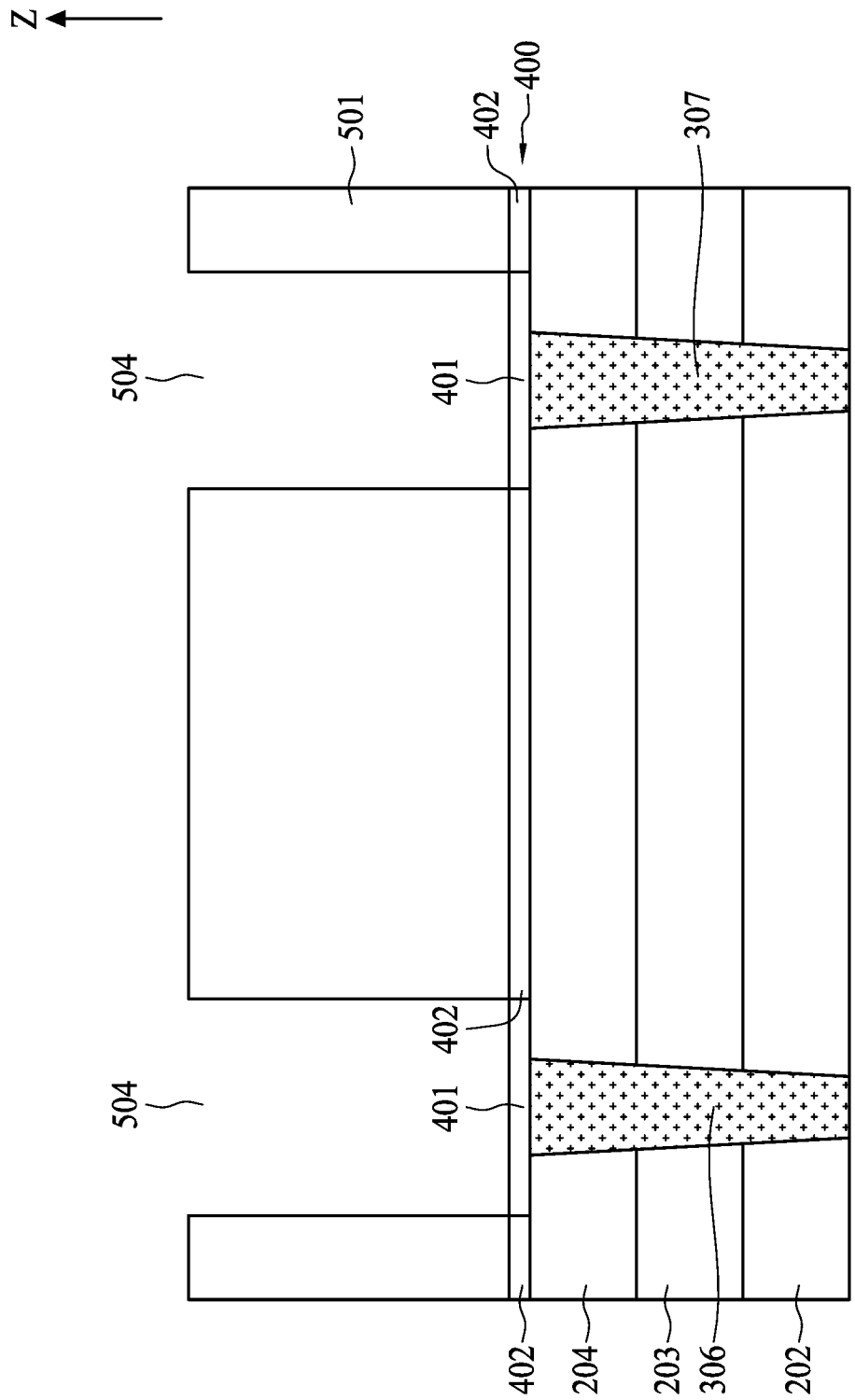
Figure 26:
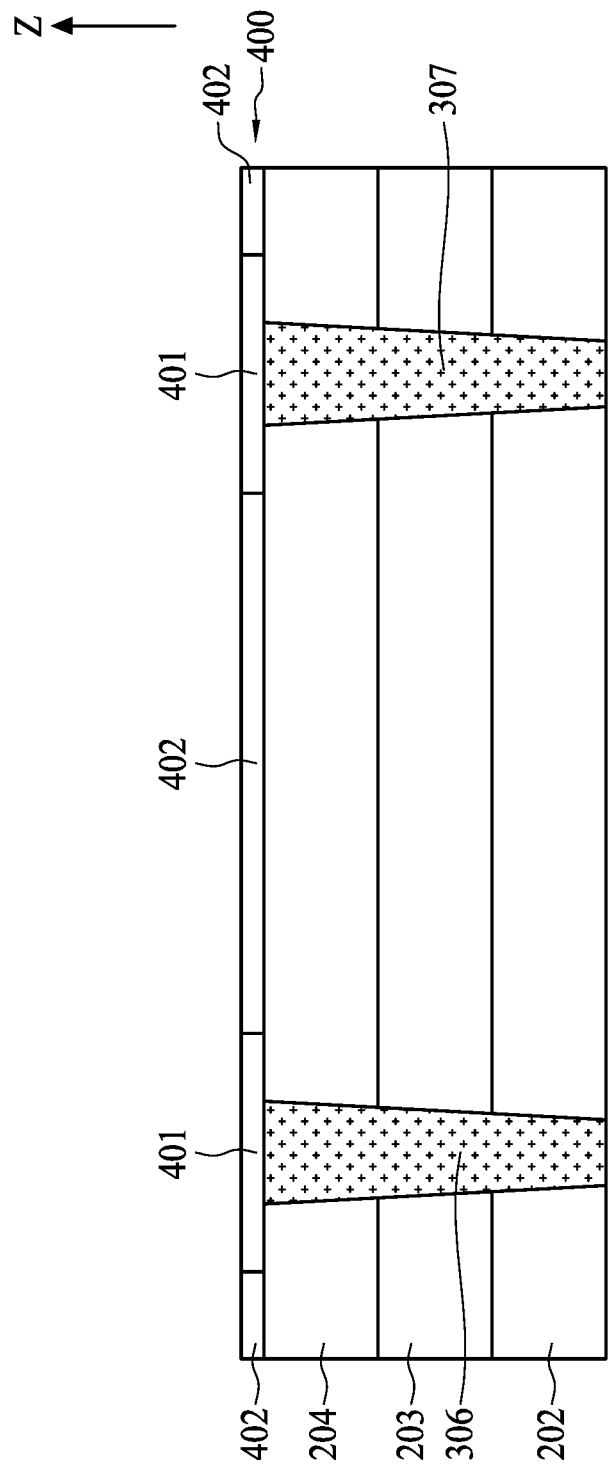

With reference to FIGS. 24 to 26, an implantation process may be used to implant dopant such as nitrogen or a nitrogen-containing material to the portions of the growing base film 400 through the plurality of first recesses 504 and convert the portions of the growing base film 400 into the plurality of doped segments 401. Other portions of the growing base film 400 which are protected by the photoresist layer 501 are regarded as a plurality of undoped segments 402; in other words, after the implantation process, the growing base film 400 is converted into the plurality of doped segments 401 and the plurality of undoped segments 402. After the stripping of the photoresist layer 501, both the plurality of doped segments 401 and the plurality of undoped segments 402 are exposed. The plurality of doped segments 401 are respectively correspondingly above the first plug 306 and the second plug 307. In addition, top surfaces of the plurality of doped segments 401 may be more hydrophilic than top surfaces of the plurality of undoped segments 402.

Figure 27:
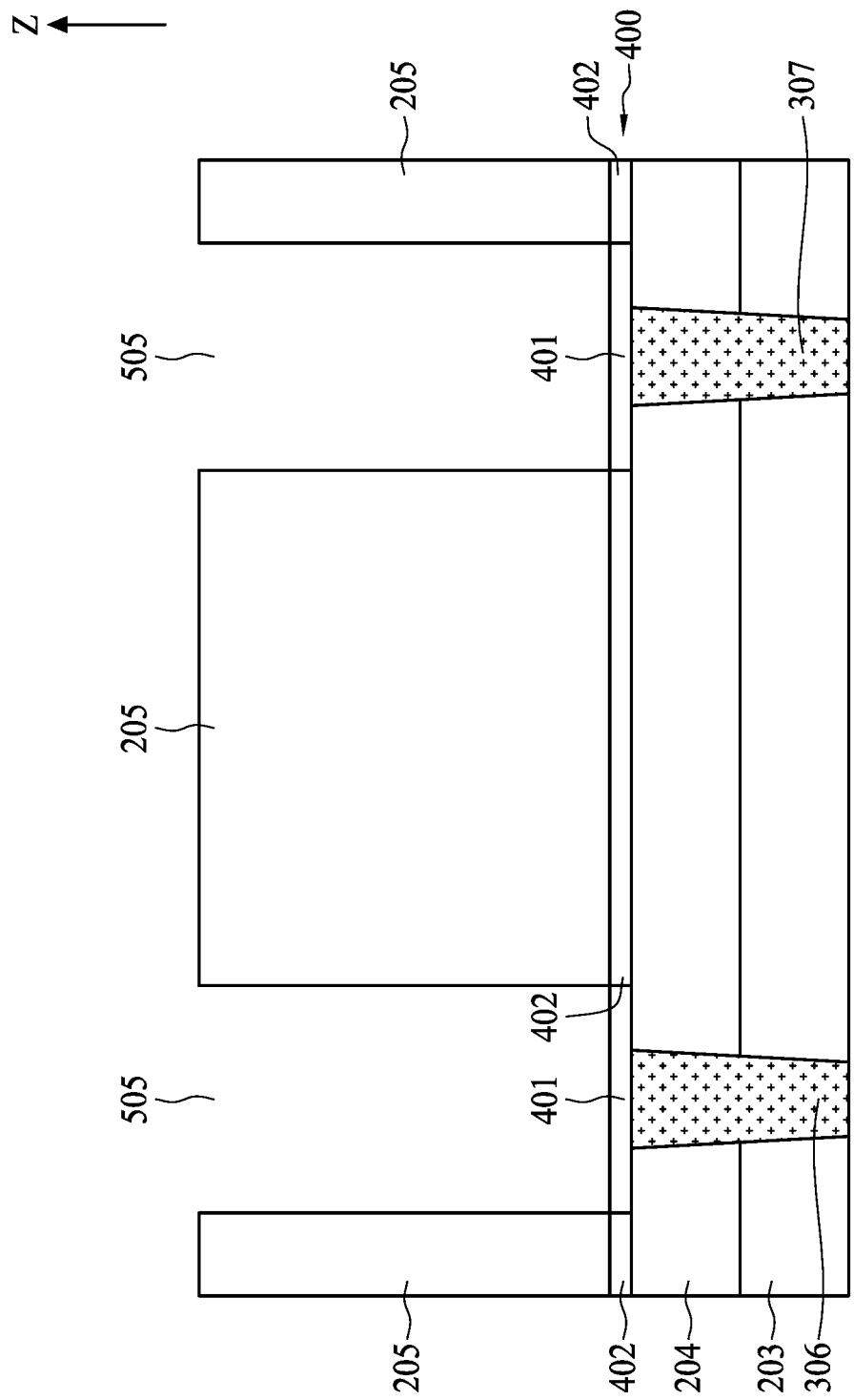
Figure 28:
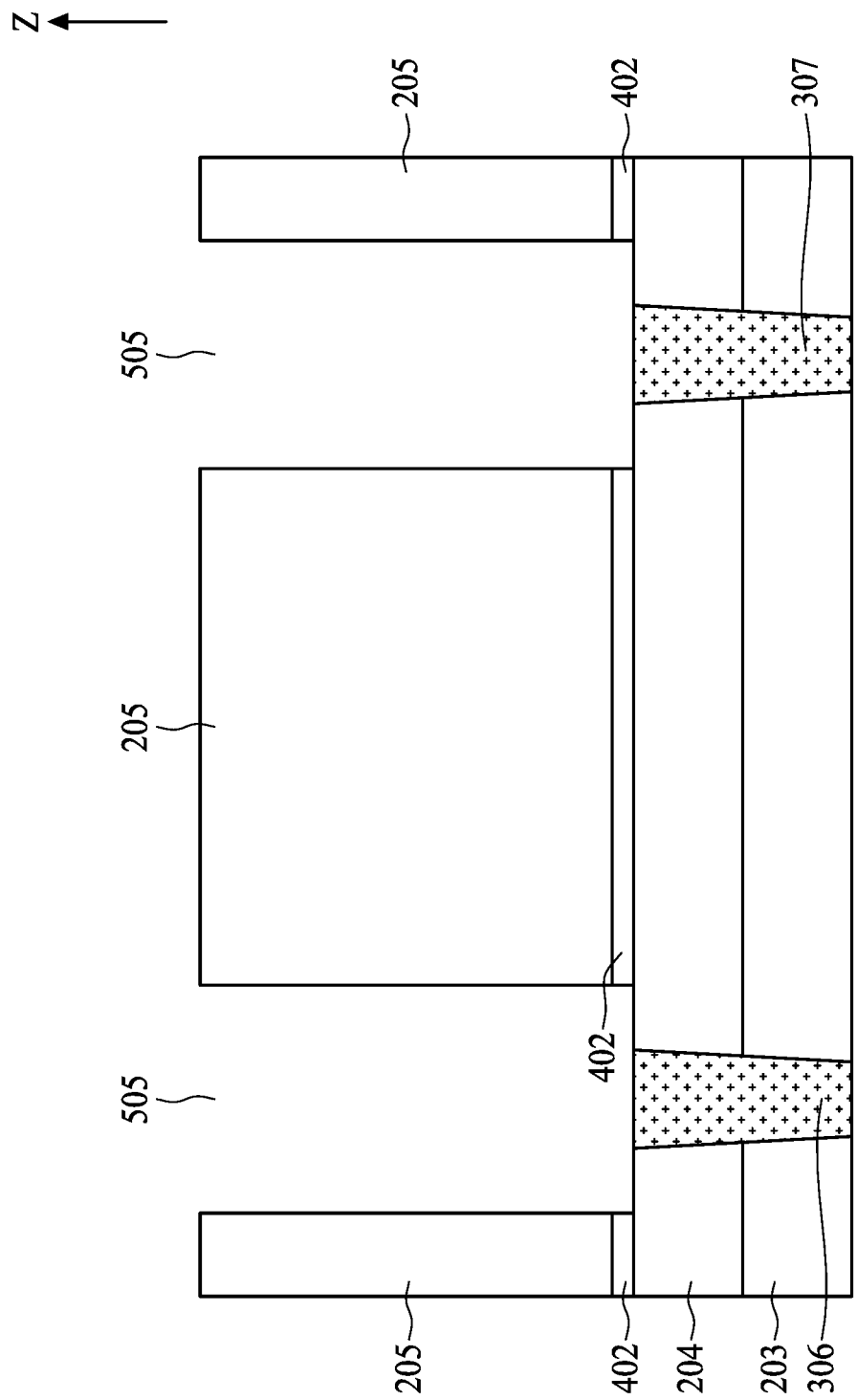

With reference to FIG. 1, FIG. 27 and FIG. 28, at step S33, a plurality of insulating segments 205 may be formed above the fourth insulating film 204 and the plurality of doped segments 401 may be removed. In the embodiment depicted, the plurality of insulating segments 205 may be correspondingly selectively formed on the plurality of undoped segments 402 by a deposition process such as chemical vapor deposition in the presence of ozone and tetraethyloxysilane. A plurality of second recesses 505 are respectively correspondingly formed between adjacent pairs of the plurality of insulating segments 205. The plurality of doped segments 401 may be removed by, for example, a wet etch process using hot phosphoric acid. After the removing of the plurality of doped segments 401, the first plug 306 and the second plug 307 are respectively exposed through the plurality of second recesses 505.

Figure 29:
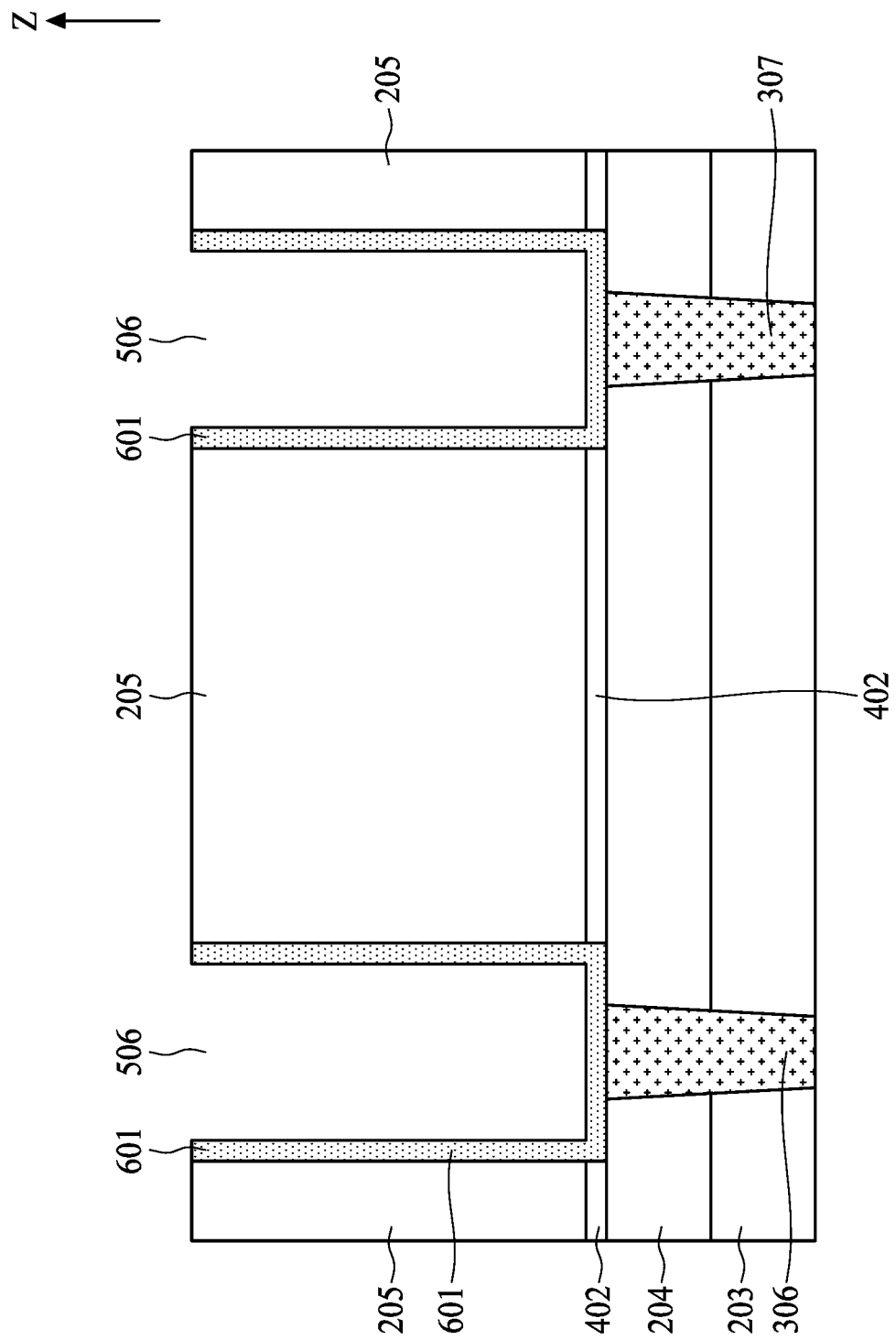

With reference to FIG. 1 and FIGS. 29 to 31, at step S35, a plurality of capacitor structures 600 may be formed above the fourth insulating film 204. With reference to FIG. 29, in the embodiment depicted, a plurality of bottom electrodes 601 may be correspondingly respectively formed in the plurality of second recesses 505. A deposition process may be performed to deposit the plurality of bottom electrodes 601 on top surfaces and sidewalls of the plurality of insulating segments 205 and bottoms of the plurality of second recesses 505, and a plurality of third recesses 506 are formed among the bottom electrodes 601 deposited on the sidewalls of the plurality of insulating segments 205 and the bottom electrodes 601 deposited on the bottoms of the plurality of second recesses 505. After the deposition process, a photoresist layer may be deposited from above and into the plurality of third recesses 506 to cover the bottom electrodes 601 deposited on the top surfaces of the plurality of insulating segments 205. An etch process, such as an anisotropic dry etch process, may be performed to remove the bottom electrodes 601 deposited on the top surfaces of the plurality of insulating segments 205. After the etch process, the photoresist remaining in the plurality of third recesses 506 may be removed by a wet etch process. The plurality of bottom electrodes 601 may be formed of, for example, doped polysilicon, metal silicide, aluminum, copper, or tungsten.

Figure 30:
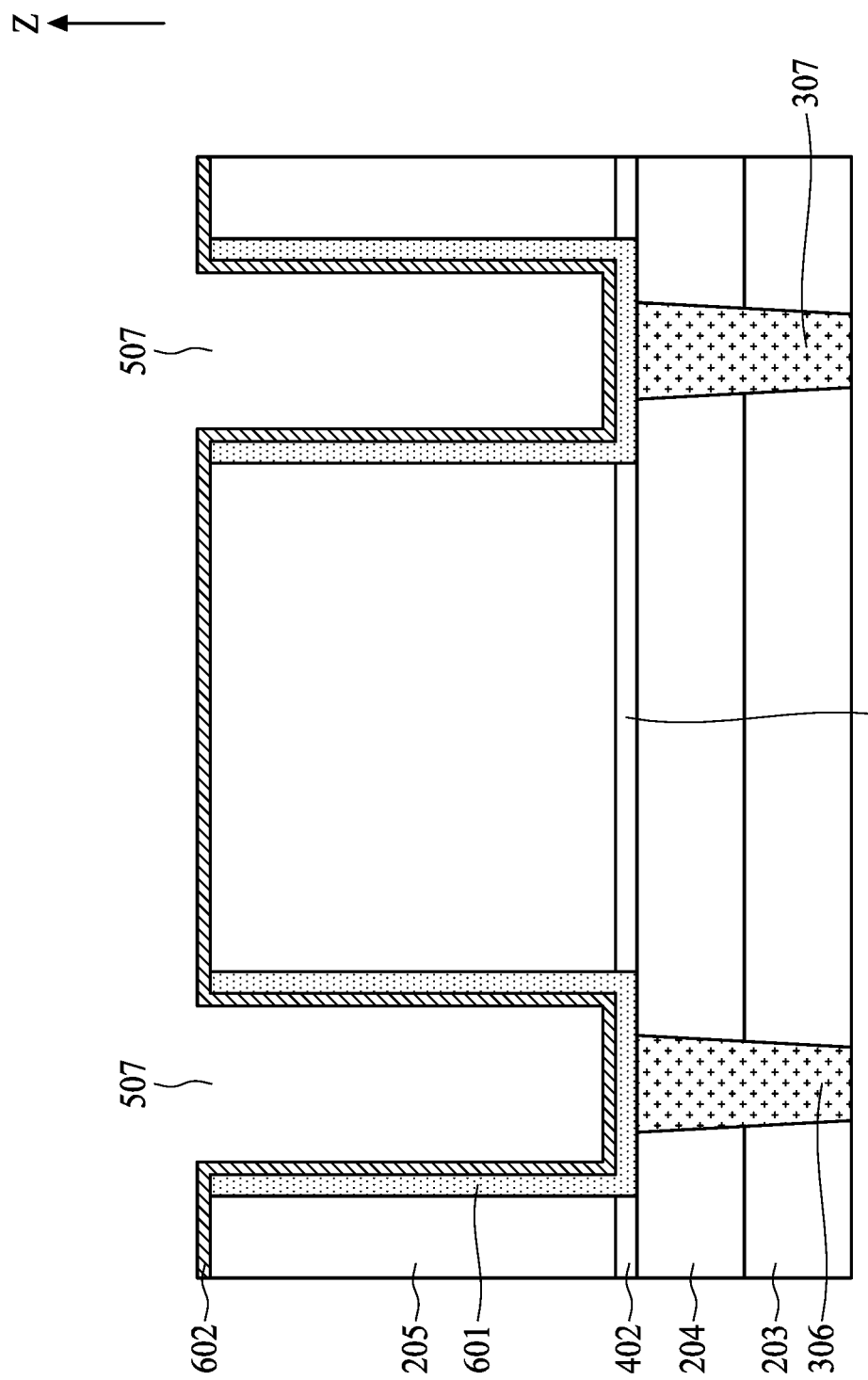

With reference to FIG. 30, in the embodiment depicted, a capacitor insulating layer 602 may be formed to attach to the plurality of bottom electrodes 601 and the top surfaces of the plurality of insulating segments 205. A plurality of fourth recesses 507 are formed in the capacitor insulating layer 602 attached to the plurality of bottom electrodes 601. The capacitor insulating layer 602 may be a single layer or multiple layers. In the embodiment depicted, the capacitor insulating layer 602 may be a single layer formed of a high dielectric constant material such as barium strontium titanate, lead zirconium titanate, titanium oxide, aluminum oxide, hafnium oxide, yttrium oxide, zirconium oxide, or the like. Alternatively, in another embodiment depicted, the capacitor insulating layer 602 may be multiple layers consisting of silicon oxide, silicon nitride, and silicon oxide.

Figure 31:
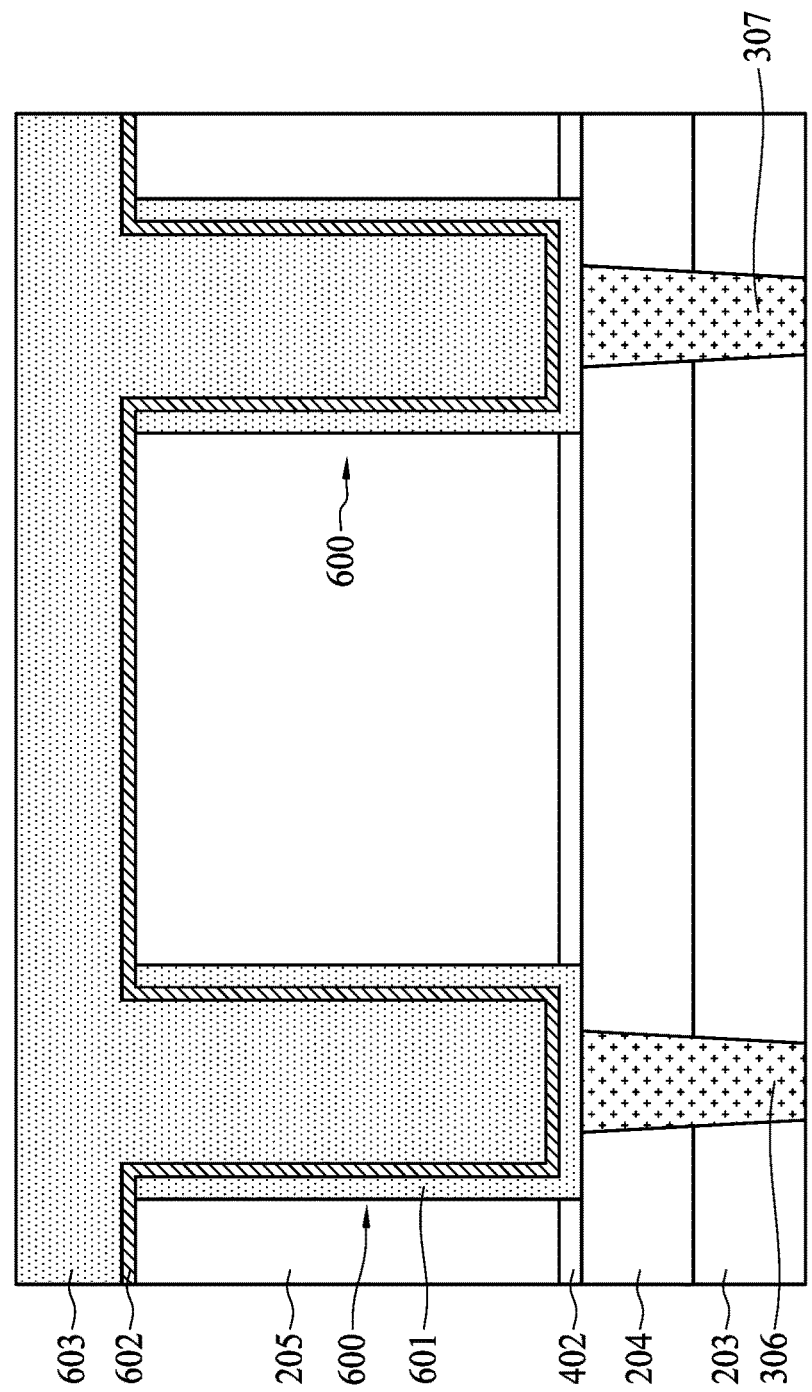

With reference to FIG. 31, a top electrode 603 may be formed to fill the plurality of fourth recesses 507 and cover the capacitor insulating layer 602. The top electrode 603 may be formed of, for example, doped polysilicon, copper, or aluminum. The plurality of bottom electrodes 601, the capacitor insulating layer 602, and the top electrode 603 together form the plurality of capacitor structures 600.

With reference to FIG. 1, and FIGS. 32 to 35, at step S37, a plurality of conductive elements may be formed above the plurality of capacitor structures 600. The plurality of conductive elements may include a bottom via 308, a plurality of first conductive layers 309, a plurality of first conductive vias 310, a plurality of second conductive layers 311, and a conductive pad 312.

Figure 32:
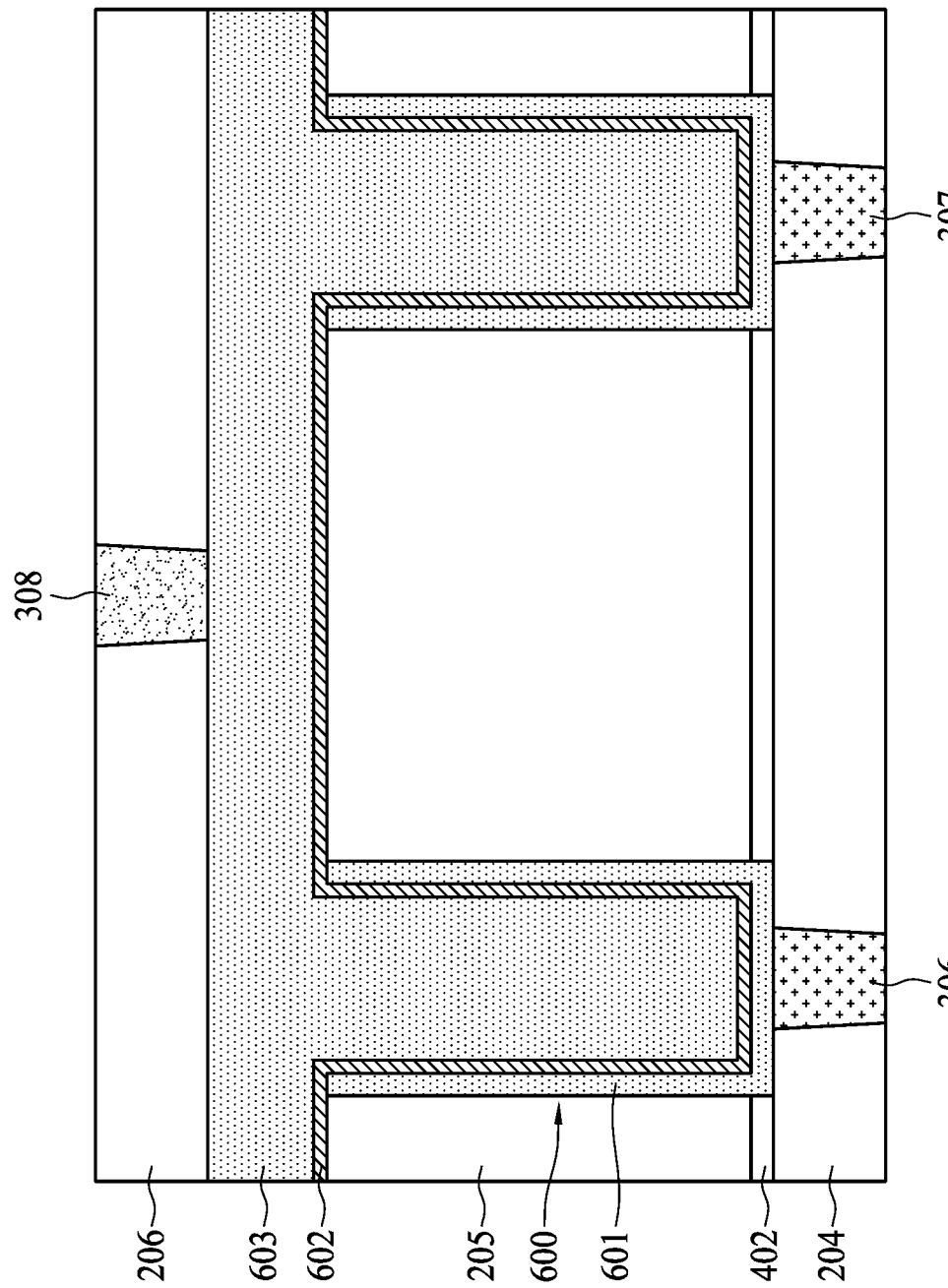

With reference to FIG. 32, in the embodiment depicted, a fifth insulating film 206 may be formed above the top electrode 603. The bottom via 308 may be formed in the fifth insulating film 206 and is electrically connected to the top electrode 603. A photolithography process may be used to pattern the fifth insulating film 206 to define positions of the bottom via 308. An etch process, such as an anisotropic dry etch process, may be performed after the photolithography process to form a bottom via opening passing through the fifth insulating film 206. After the etch process, a conductive material, for example, aluminum, copper, tungsten, cobalt, or other suitable metal or metal alloy is deposited, by a metallization process such as chemical vapor deposition, physical vapor deposition, sputtering, or the like, in the bottom via opening to form the bottom via 308. A planarization process, such as chemical mechanical polishing, may be performed after the metallization process to remove excess deposited material and provide a substantially flat surface for subsequent processing steps. The fifth insulating film 206 may be formed of, for example, silicon oxide, silicon nitride, silicon oxynitride, silicon nitride oxide, fluoride-doped silicate, or a combination thereof, but is not limited thereto. Additionally, a barrier layer (not shown) may be respectively formed on sidewalls and bottoms of the bottom via opening prior to the metallization process. The barrier layer may be formed of titanium, titanium nitride, titanium-tungsten alloy, tantalum, tantalum nitride, or the combination thereof, and may be formed by physical vapor deposition, sputtering, or the like.

Figure 33:
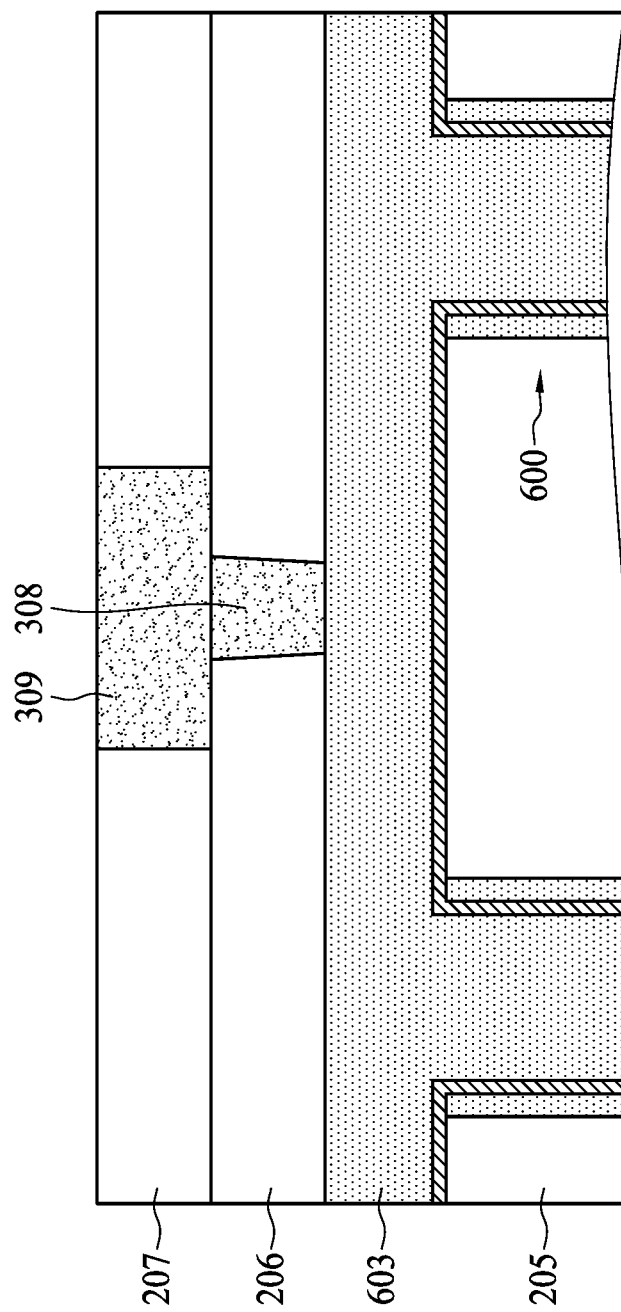

With reference to FIG. 33, in the embodiment depicted, a sixth insulating film 207 may be formed above the fifth insulating film 206. The plurality of first conductive layers 309 (only one of which is shown in FIG. 33 for simplicity) may be formed in the sixth insulating film 207 and are electrically connected to the bottom via 308. A photolithography process may be used to pattern the sixth insulating film 207 to define positions of the plurality of first conductive layers 309. An etch process, such as an anisotropic dry etch process, may be performed after the photolithography process to form a plurality of trench openings passing through the sixth insulating film 207. After the etch process, a conductive material, for example, aluminum, copper, tungsten, cobalt, or other suitable metal or metal alloy is deposited, by a metallization process such as chemical vapor deposition, physical vapor deposition, sputtering, or the like, in the plurality of trench openings to form the plurality of first conductive layers 309. A planarization process, such as chemical mechanical polishing, may be performed after the metallization process to remove excess deposited material and provide a substantially flat surface for subsequent processing steps. The sixth insulating film 207 may be formed of, for example, silicon oxide, silicon nitride, silicon oxynitride, silicon nitride oxide, fluoride-doped silicate, or a combination thereof, but is not limited thereto. Additionally, a plurality of barrier layers (not shown) may be respectively formed on sidewalls and bottoms of the plurality of trench openings prior to the metallization process. The plurality of barrier layers may be formed of titanium, titanium nitride, titanium-tungsten alloy, tantalum, tantalum nitride, or the combination thereof, and may be formed by physical vapor deposition, sputtering, or the like.

Figure 34:
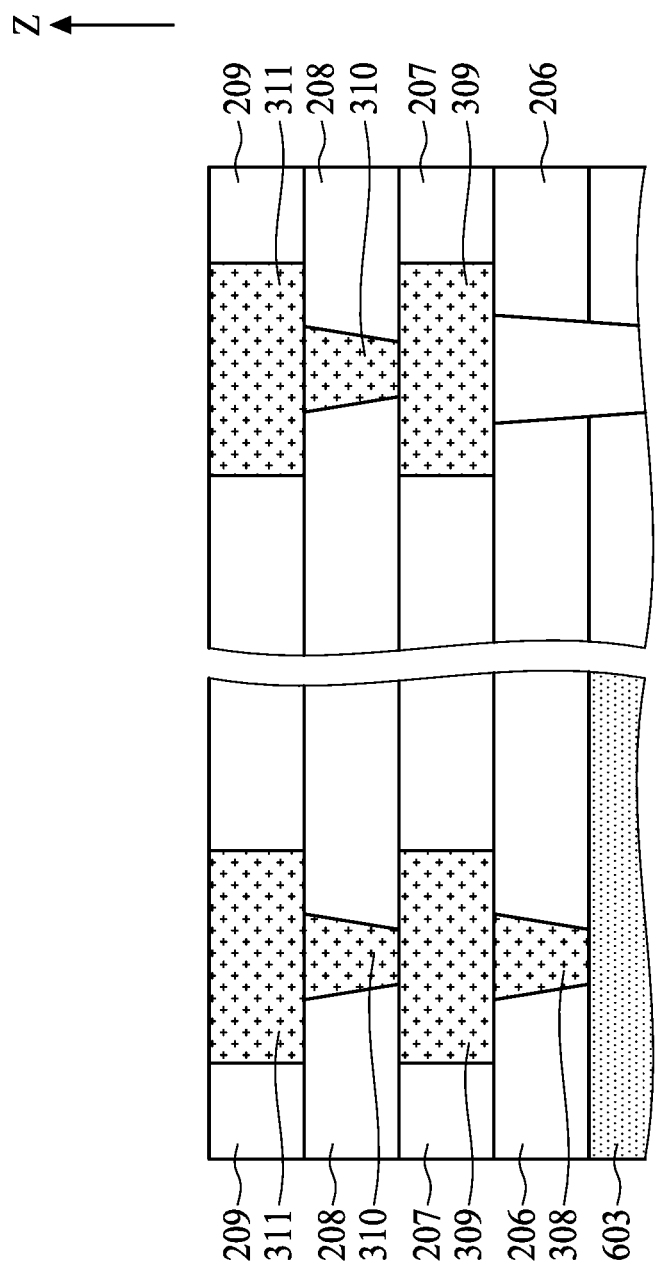

With reference to FIG. 34, in the embodiment depicted, a seventh insulating film 208 may be formed on the sixth insulating film 207. An eighth insulating film 209 may be formed on the seventh insulating film 208. The plurality of first conductive vias 310 may be formed in the seventh insulating film 208 and are electrically connected to the plurality of first conductive layers 309. The plurality of second conductive layers 311 may be formed in the eighth insulating film 209 and are electrically connected to the plurality of first conductive vias 310. The seventh insulating film 208 and the eighth insulating film 209 may be formed of, for example, silicon oxide, silicon nitride, silicon oxynitride, silicon nitride oxide, fluoride-doped silicate, or a combination thereof, but are not limited thereto.

With reference to FIG. 34, in the embodiment depicted, a first photolithography process may be used to pattern the eighth insulating film 209 to define positions of the plurality of first conductive vias 310. A first etch process, such as an anisotropic dry etch process, may be performed after the first photolithography process to form a plurality of via openings in the seventh insulating film 208 and the eighth insulating film 209. After the first etch process, a second photolithography process may be used to pattern the eighth insulating film 209 to define positions of the plurality of second conductive layers 311. The positions of the plurality of second conductive layers 311 overlap the plurality of via openings in the seventh insulating film 208. During the second photolithography process, the plurality of via openings in the seventh insulating film 208 and the eighth insulating film 209 are filled with photoresist. A second etch process, such as an anisotropic dry etch process, may be performed after the second photolithography process to form a plurality of trench openings in the eighth insulating film 209. After the second etch process, a conductive material, for example, aluminum, copper, tungsten, cobalt, or other suitable metal or metal alloy, is deposited, by a metallization process such as chemical vapor deposition, physical vapor deposition, sputtering, electroplating, electroless plating, or the like, in the plurality of trench openings and the plurality of via openings to form the plurality of first conductive vias 310 and the plurality of second conductive layers 311. A planarization process, such as chemical mechanical polishing, may be performed after the metallization process to remove excess deposited material and provide a substantially flat surface for subsequent processing steps. Additionally, a plurality of barrier layers (not shown) may be respectively formed on sidewalls and bottoms of the plurality of trench openings and sidewalls of the plurality of via openings prior to the metallization process. The plurality of barrier layers may be formed of titanium, titanium nitride, titanium-tungsten alloy, tantalum, tantalum nitride, or the combination thereof, and may be formed by physical vapor deposition, sputtering, or the like.

Figure 35:
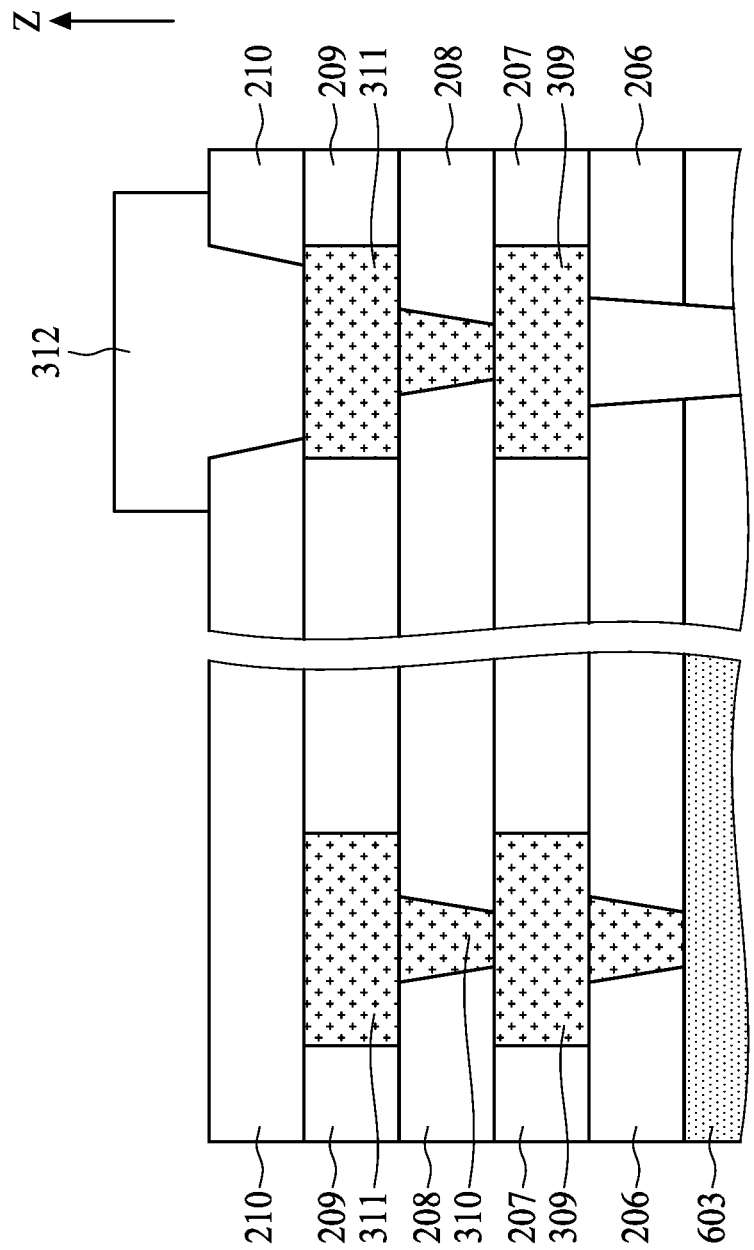

With reference to FIG. 35, in the embodiment depicted, a ninth insulating film 210 may be formed on the eighth insulating film 209. A conductive pad may be formed to pass through the ninth insulating film 210 and is electrically connected to the plurality of second conductive layers 311. The ninth insulating film 210 may be formed of, for example, silicon oxide, silicon nitride, silicon oxynitride, silicon nitride oxide, fluoride-doped silicate, or a combination thereof, but is not limited thereto.

Due to the design of the fabrication of the semiconductor device of the present disclosure, the plurality of insulating segments 205 selectively formed on the plurality of undoped segments 402 may provide sufficient support for the plurality of capacitor structures 600 and prevent the plurality of capacitor structures 600 from collapsing during subsequent semiconductor processes such as etching, chemical mechanical polishing, packaging, etc.

Figure 36:
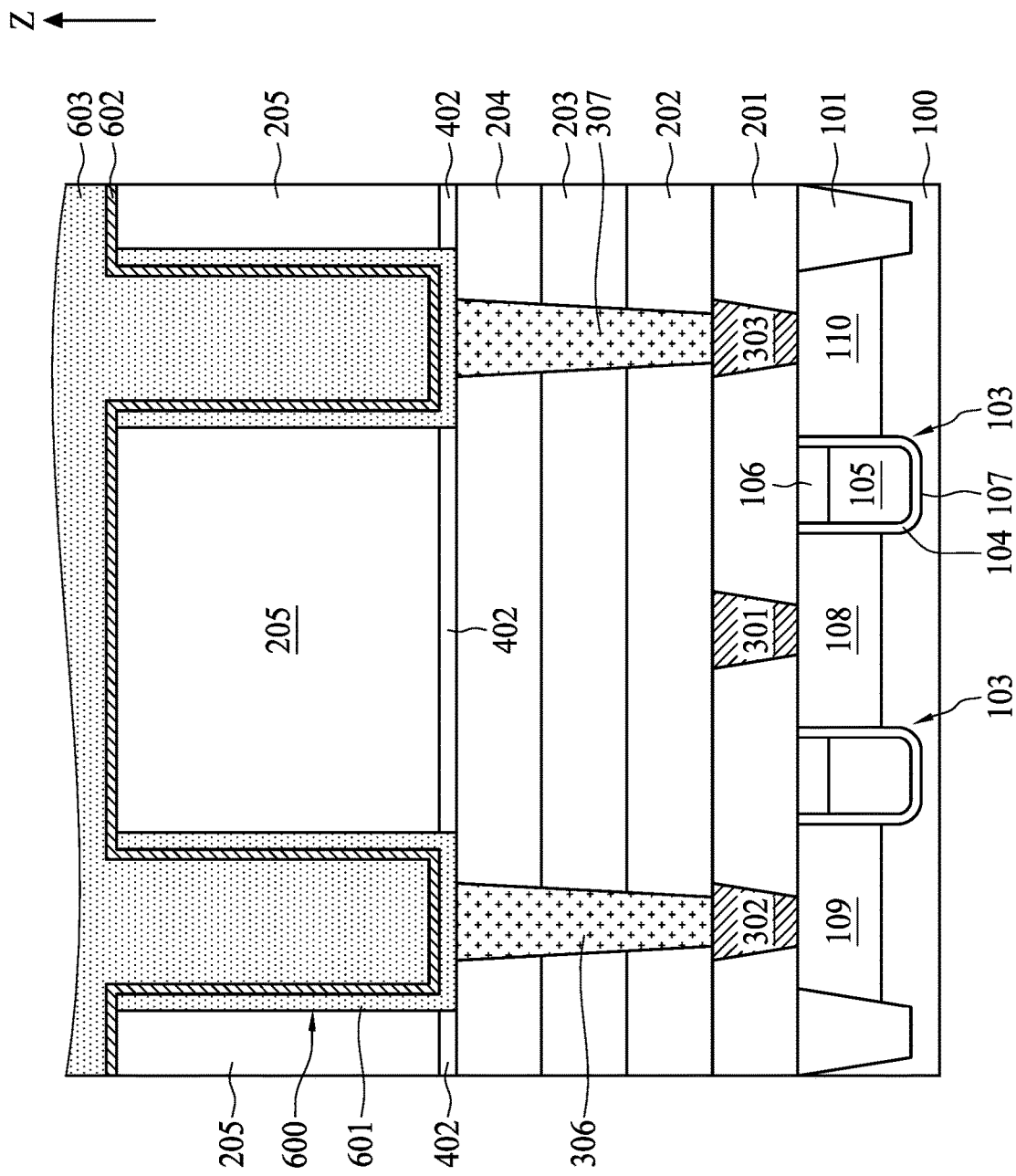
FIG. 36 illustrates, in a schematic cross-sectional diagram, a semiconductor device in accordance with one embodiment of the present disclosure.

FIG. 36 illustrates, in a schematic cross-sectional diagram, a semiconductor device in accordance with one embodiment of the present disclosure.

With reference to FIG. 36, the semiconductor device includes a substrate 100, a plurality of isolation structures 101, a plurality of control structures 103, a plurality of doped regions, a first insulating film 201, a second insulating film 202, a third insulating film 203, a fourth insulating film 204, a plurality of insulating segments 205, a plurality of contacts, a plurality of plugs, a plurality of undoped segments 402, and a plurality of capacitor structures 600.

The substrate 100 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, or indium gallium phosphide.

With reference to FIG. 36, the plurality of isolation structures 101 may be disposed in the substrate 100 and are separated from each other. The plurality of isolation structures 101 may be formed of, for example, an insulating material such as silicon oxide, silicon nitride, silicon oxynitride, silicon nitride oxide, fluoride-doped silicate, or the like.

With reference to FIG. 36, the plurality of control structures 103 may be disposed in the substrate 100. Each of the plurality of control structures 103 includes a bottom layer 104, a middle layer 105, and a top layer 106. A photolithography process may be used to pattern the substrate 100 to define positions of the plurality of control structures 103. An etch process, such as an anisotropic dry etch process, may be performed after the photolithography process to form a plurality of trench openings 114 in the substrate 100. The bottom layers 104 may be respectively correspondingly disposed on sidewalls of the plurality of trench openings 114. The bottom layers 104 may be formed of, for example, silicon oxide, silicon oxynitride, silicon nitride oxide, silicon nitride, or the like. The middle layers 105 may be respectively correspondingly disposed on the bottom layers 104. The middle layers 105 may be formed of, for example, doped polysilicon, metal material, or metal silicide. Metal silicide may be, for example, nickel silicide, platinum silicide, titanium silicide, molybdenum silicide, cobalt silicide, tantalum silicide, tungsten silicide, or the like. The top layers 106 may be disposed on the middle layers 105 and top surfaces of the top layers may be at the same vertical level as a top surface of the substrate 100. The top layers 106 may be formed of, for example, silicon oxide, silicon oxynitride, silicon nitride oxide, silicon nitride, or the like.

With reference to FIG. 36, the plurality of doped regions may be respectively disposed in the substrate 100 and are respectively adjacent to the plurality of control structures 103. The plurality of doped regions include a first doped region 108, a second doped region 109, and a third doped region 110. The first doped region 108 is disposed between an adjacent pair of the plurality of control structures 103. The second doped region 109 is disposed between one of the plurality of isolation structures 101 and one of the adjacent pair of the plurality of control structures 103. The third doped region 110 is disposed between another one of the plurality of isolation structures 101 and another one of the adjacent pair of the plurality of control structures 103. The first doped region 108, the second doped region 109, and the third doped region 110 are respectively doped by a dopant such as phosphorus, arsenic, or antimony. The first doped region 108, the second doped region 109, and the third doped region 110 respectively has a dopant concentration ranging from about 1E17 atoms/cm$^3$ to about 1E19 atoms/cm$^3$.

With reference to FIG. 36, the first insulating film 201 may be disposed on the substrate 100. The first insulating film 201 may be formed of, for example, silicon nitride, silicon oxide, silicon oxynitride, undoped silica glass, borosilica glass, phosphosilica glass, borophosphosilica glass, or a combination thereof, but is not limited thereto.

With reference to FIG. 36, the plurality of contacts may be disposed in the first insulating film 201. The plurality of contacts include a first contact 301, a second contact 302, and a third contact 303. The first contact 301 is disposed on the first doped region 108 and is electrically connected to the first doped region 108. The second contact 302 is disposed on the second doped region 109 and is electrically connected to the second doped region 109. The third contact 303 is disposed on the third doped region 110 and is electrically connected to the third doped region 110. The first contact 301, the second contact 302, and the third contact 303 may be formed of, for example, aluminum, copper, tungsten, cobalt, or other suitable metal or metal alloy.

With reference to FIG. 36, the second insulating film 202 may be disposed on the first insulating film 201. The second insulating film 202 may be formed of, for example, silicon nitride, silicon oxide, silicon oxynitride, undoped silica glass, borosilica glass, phosphosilica glass, borophosphosilica glass, or a combination thereof, but is not limited thereto. The third insulating film 203 may be disposed on the second insulating film 202. The third insulating film 203 may be formed of, for example, silicon nitride, silicon oxide, silicon oxynitride, undoped silica glass, borosilica glass, phosphosilica glass, borophosphosilica glass, or a combination thereof, but is not limited thereto. The fourth insulating film 204 may be disposed on the third insulating film 203. The fourth insulating film 204 may be formed of, for example, silicon nitride, silicon oxide, silicon oxynitride, undoped silica glass, borosilica glass, phosphosilica glass, borophosphosilica glass, or a combination thereof, but is not limited thereto.

With reference to FIG. 36, the plurality of plugs may be disposed passing through the fourth insulating film 204, the third insulating film 203, and the second insulating film 202. The plurality of plugs may include a first plug 306 and a second plug 307. The first plug 306 passes through the fourth insulating film 204, the third insulating film 203, and the second insulating film 202 and is electrically connected to the second contact 302; that is, the first plug 306 is electrically coupled to the second doped region 109. The second plug 307 passes through the fourth insulating film 204, the third insulating film 203, and the second insulating film 202 and is electrically connected to the third contact 303; that is, the second plug 307 is electrically coupled to the third doped region 110. The first plug 306 and the second plug 307 may be formed of, for example, aluminum, copper, tungsten, cobalt, or other suitable metal or metal alloy.

With reference to FIG. 36, the plurality of undoped segments 402 may be disposed on the fourth insulating film 204. A growing base film 400 may be disposed on the fourth insulating film 204. A deposition process such as chemical vapor deposition or the like is used to form the growing base film. The growing base film may be formed of, for example, an insulating material without nitrogen. The insulating material without nitrogen may be silicon oxide, undoped silica glass, borosilica glass, phosphosilica glass, or borophosphosilica glass. A photoresist layer may be disposed on the growing base film to pattern the growing base film. After the developing of the photoresist layer, an implantation process may be used to implant dopant such as nitrogen or a nitrogen-containing material to the portions of the growing base film and turn the portions of the growing base film into the plurality of doped segments. Other portions of the growing base film which are protected by the photoresist layer are regarded as the plurality of undoped segments 402. The plurality of undoped segments 402 may be formed of silicon oxide, undoped silica glass, borosilica glass, phosphosilica glass, or borophosphosilica glass.

With reference to FIG. 36, the plurality of insulating segments 205 may be correspondingly selectively disposed on the plurality of undoped segments 402. The plurality of insulating segments 205 may be formed by a deposition process such as chemical vapor deposition in the presence of ozone and tetraethyloxysilane.

With reference to FIG. 36, the plurality of capacitor structures 600 may be disposed between adjacent pairs of the plurality of insulating segments 205. The plurality of capacitor structures 600 may include a plurality of bottom electrodes 601, a capacitor insulating layer 602, and a top electrode 603. The plurality of bottom electrodes 601 may be disposed between adjacent pairs of the plurality of insulating segments 205 and are respectively correspondingly electrically connected to the first plug 306 and the second plug 307. The plurality of bottom electrodes 601 may be formed of, for example, doped polysilicon, metal silicide, aluminum, copper, or tungsten.

With reference to FIG. 36, the capacitor insulating layer 602 may cover the plurality of bottom electrodes 601 and top surfaces of the plurality of insulating segments 205. The capacitor insulating layer 602 may be a single layer or multiple layers. In the embodiment depicted, the capacitor insulating layer 602 may be a single layer formed of a high dielectric constant material such as barium strontium titanate, lead zirconium titanate, titanium oxide, aluminum oxide, hafnium oxide, yttrium oxide, zirconium oxide, or the like. Alternatively, in another embodiment depicted, the capacitor insulating layer 602 may be multiple layers consisting of silicon oxide, silicon nitride, and silicon oxide.

With reference to FIG. 36, the top electrode 603 may be disposed to cover the capacitor insulating layer 602. The top electrode 603 may be formed of, for example, doped polysilicon, copper, or aluminum.

Due to the design of the semiconductor device of the present disclosure, the plurality of insulating segments 205 formed on the plurality of undoped segments 402 may provide sufficient support for the plurality of capacitor structures 600 and prevent the plurality of capacitor structures 600 from collapsing during semiconductor processes such as etching, chemical mechanical polishing, packaging, etc.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
providing a substrate;
forming a growing base film above the substrate;
forming a plurality of doped segments and a plurality of undoped segments in the growing base film;
selectively forming a plurality of insulating segments on the plurality of undoped segments;
removing the plurality of doped segments; and
forming a plurality of capacitor structures above the substrate.

2. The method for fabricating the semiconductor device of claim 1, wherein forming the plurality of doped segments and the plurality of undoped segments in the growing base film comprise patterning the growing base film with a photoresist layer and a mask, implanting the growing base film from above, and removing the photoresist layer.

3. The method for fabricating the semiconductor device of claim 1, wherein the substrate is formed of silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, or indium gallium phosphide.

4. The method for fabricating the semiconductor device of claim 1, wherein the growing base film is formed of an insulating material without nitrogen.

5. The method for fabricating the semiconductor device of claim 1, wherein the growing base film is formed of silicon oxide, undoped silica glass, borosilica glass, phosphosilica glass, or borophosphosilica glass.

6. The method for fabricating the semiconductor device of claim 1, wherein the plurality of insulating segments are formed by chemical vapor deposition in a presence of ozone and tetraethyloxysilane.

7. The method for fabricating the semiconductor device of claim 1, wherein the plurality of doped segments comprise nitrogen.

8. The method for fabricating the semiconductor device of claim 1, wherein each of the plurality of capacitor structures comprises a bottom electrode, a capacitor insulating layer, and a top electrode.

9. The method for fabricating the semiconductor device of claim 8, wherein the capacitor insulating layer is formed of barium strontium titanate, lead zirconium titanate, titanium oxide, aluminum oxide, hafnium oxide, yttrium oxide, or zirconium oxide.

10. The method for fabricating the semiconductor device of claim 8, wherein the capacitor insulating layers are formed of multiple layers consisting of silicon oxide, silicon nitride, and silicon oxide.

11. The method for fabricating the semiconductor device of claim 8, wherein the bottom electrode is formed of doped polysilicon, metal silicide, aluminum, copper, or tungsten.

12. The method for fabricating the semiconductor device of claim 8, wherein the top electrode is formed of doped polysilicon, copper, or aluminum.

13. The method for fabricating the semiconductor device of claim 1, further comprising forming, after providing the substrate, a plurality of isolation structures in the substrate.

14. The method for fabricating the semiconductor device of claim 13, wherein the plurality of isolation structures are formed of silicon oxide, silicon nitride, silicon oxynitride, silicon nitride oxide, or fluoride-doped silicate.

15. The method for fabricating the semiconductor device of claim 1, further comprising forming a plurality of bit line contacts above the substrate.

16. The method for fabricating the semiconductor device of claim 15, wherein the plurality of bit line contacts are formed of aluminum, copper, tungsten, cobalt, or the combination thereof.

17. The method for fabricating the semiconductor device of claim 1, further comprising forming a plurality of bit lines above the substrate.

18. The method for fabricating the semiconductor device of claim 17, wherein the plurality of bit lines are formed of aluminum or copper.

* * * * *